(12) United States Patent
Clevenger

(10) Patent No.: US 12,408,471 B2
(45) Date of Patent: Sep. 2, 2025

(54) AUTOMATED ASSEMBLY AND MOUNTING OF SOLAR CELLS ON PANELS

(71) Applicant: SolAero Technologies Corp., Albuquerque, NM (US)

(72) Inventor: Marvin B Clevenger, Albuquerque, NM (US)

(73) Assignee: SOLAERO TECHNOLOGIES CORP., Albuquerque, NM (US)

( * ) Notice: Subject to any disclaimer, the term of this patent is extended or adjusted under 35 U.S.C. 154(b) by 843 days.

(21) Appl. No.: 17/694,164

(22) Filed: Mar. 14, 2022

(65) Prior Publication Data

US 2022/0199850 A1    Jun. 23, 2022

Related U.S. Application Data

(60) Continuation-in-part of application No. 17/198,916, filed on Mar. 11, 2021, now Pat. No. 12,119,424, which is a division of application No. 16/802,269, filed on Feb. 26, 2020, now abandoned, which is a division of application No. 16/196,765, filed on Nov. 20, 2018, now Pat. No. 10,629,768, which is a division of application No. 15/241,418, filed on Aug. 19, 2016, now Pat. No. 10,276,742, which is a
(Continued)

(51) Int. Cl.
*H10F 71/00* (2025.01)
*B29C 65/78* (2006.01)
*H10F 19/00* (2025.01)
*H10F 19/80* (2025.01)
*H10F 19/85* (2025.01)

(52) U.S. Cl.
CPC ........... *H10F 71/137* (2025.01); *B29C 65/78* (2013.01); *H10F 19/00* (2025.01); *H10F 19/80* (2025.01); *H10F 19/85* (2025.01); *Y02E 10/50* (2013.01); *Y02P 70/50* (2015.11)

(58) Field of Classification Search
CPC . H01L 31/1876; H01L 31/049; H01L 31/042; H01L 31/048; Y02E 10/50; Y02E 10/544; Y02P 70/50; B29C 65/78; H10F 71/137; H10F 19/85; H10F 19/80; H10F 19/00
See application file for complete search history.

(56) References Cited

U.S. PATENT DOCUMENTS

2010/0147364 A1* 6/2010 Gonzalez ................ H10F 19/70
　　　　　　　　　　　　　　　　　　　　　　　　　　136/251
2011/0209739 A1* 9/2011 Pingree .................. H10N 10/01
　　　　　　　　　　　　　　　　　　　　　　　　　　156/197
(Continued)

*Primary Examiner* — Zandra V Smith
*Assistant Examiner* — John M Parker

(57) ABSTRACT

A method of fabricating a solar cell array module or panel comprising providing a support, providing a face sheet having a top side and an opposite bottom side, mounting the bottom side of the face sheet on the support, dispensing an adhesive on a plurality of discrete predefined regions on the top side of the face sheet where a string of solar cell assemblies is to be mounted using an automated process, positioning and mounting an interconnected string of solar cell assemblies on the adhesive regions on the top side of the face sheet using machine vision, and applying heat or pressure to bond the interconnected string of solar cell assemblies to the adhesive regions on the top side of the face sheet.

19 Claims, 18 Drawing Sheets

Related U.S. Application Data continuation of application No. 14/795,461, filed on Jul. 9, 2015, now Pat. No. 9,608,156.

(60) Provisional application No. 63/193,698, filed on May 27, 2021.

(56) References Cited

U.S. PATENT DOCUMENTS

| | | | |
|---|---|---|---|
| 2013/0062017 A1* | 3/2013 | Kim | B32B 37/0046 |
| | | | 156/538 |
| 2015/0093851 A1* | 4/2015 | Tu | H10F 19/908 |
| | | | 438/98 |

* cited by examiner

AUTOMATED ASSEMBLY AND MOUNTING OF SOLAR CELLS ON PANELS

REFERENCE TO RELATED APPLICATIONS

This application claims the benefit of U.S. Provisional Application Ser. No. 63/193,698 filed May 27, 2021. The present application is a continuation-in-part of U.S. patent application Ser. No. 17/198,916 filed Mar. 11, 2021, which is a division of U.S. patent application Ser. No. 16/802,269 filed Feb. 26, 2020, which is a division of U.S. patent application Ser. No. 16/196,765 filed Nov. 20, 2018, now U.S. Pat. No. 10,629,768, which is a division of U.S. patent application Ser. No. 15/241,418 filed Aug. 19, 2016, now U.S. Pat. No. 10,276,742, which is a continuation-in-part of U.S. patent application Ser. No. 14/795,461, filed Jul. 9, 2015, now U.S. Pat. No. 9,608,156.

The present application is related to U.S. patent application Ser. No. 14/592,519, filed Jan. 8, 2015, and Ser. No. 14/719,111, filed May 21, 2015, now U.S. Pat. No. 10,263,131.

All of the above related applications are incorporated herein by reference in their entireties.

BACKGROUND OF THE DISCLOSURE

1. Field of the Disclosure

The present disclosure relates to the field of photovoltaic solar arrays, and more particularly to fabrication processes utilizing, for example, multijunction solar cells based on III-V semiconductor compounds fabricated into interconnected Cell-Interconnect-Cover Glass (CIC) assemblies and mounted on a support or substrate using automated processes.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

One or more III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Conventional space solar array panels at present are most often comprised of a relatively densely packed arrangement of solar cells generally the size of the semiconductor wafer (typically 100 or 150 mm in diameter) mounted on a rigid supporting panel and operating without lenses for optical concentration of sunlight. A conventional space solar array panel may include a panel or support, solar cell assemblies disposed on the support, interconnection components for connecting the solar cell assemblies, and bypass diodes and blocking diodes also connected to the solar cells.

Individual solar cells, frequently with a rectangular or generally square-shape and sometimes with cropped corners, are connected in series to form a string of solar cells, whereby the number of solar cells used in the string determines the output voltage. Solar cells or strings of solar cells can also be interconnected in parallel, so as to increase the output current. Individual solar cells are provided with interconnects and a cover glass so as to form so-called CICs (Cell-Interconnect-Cover Glass) assemblies, which are then arranged and electrically interconnected to form a solar array. Conventionally, these large solar cells have been mounted on a support and interconnected in an assembly process using a substantial amount of manual labor. For example, first individual CICs are produced with each interconnect individually manually welded to each cell, and each cover glass individually manually mounted. Then, these CICs are connected in series to form strings, generally in a substantially manual manner, including welding or soldering steps. Then, these strings are positioned and mounted to a panel or substrate and electrically interconnected, a process that includes the application of adhesive, wiring, bonding and other assembly steps.

Close packing of the large solar cells on the space solar array panel is challenging due to requirement for interconnection of the solar cells to form a series circuit and to implement and interconnect the bypass diodes. An additional challenge can sometimes reside in the need to interconnect a plurality of strings of series connected solar cells in parallel. All of this has traditionally been carried out in a manual and substantially labor-intensive manner.

Accordingly, the present disclosure provides improved methods of manufacturing and assembling photovoltaic solar arrays that can result in decreases in cost, greater compactness, and increases in solar array performance and reliability.

SUMMARY OF THE DISCLOSURE

1. Objects of the Disclosure

It is an object of the present disclosure to provide an automated process for producing solar cell panels for space vehicles.

It is another object of the present disclosure to provide an automated assembly tool or fixture for dispensing adhesive over predefined regions on a face sheet or support for producing solar cell modules and panels for space vehicles and similar applications.

It is another object of the present disclosure to provide a supply reel, cassette or tray including a plurality of solar cell assemblies connected in series and that can be used in an automated process to form a solar array panel by automatically placing, dispensing adhesive, and bonding the solar cell assemblies to the supporting member.

It is another object of the disclosure to provide a method for making a solar cell panel using machine vision and automated alignment and positioning fixtures.

It is another object of the disclosure to provide for an assembly fixture or structure and a method using such fixture that facilitates automation of at least certain steps of the process for manufacture of solar cell assemblies or CICs and panels of interconnected CICs.

Some implementations of the present disclosure may incorporate or implement fewer of the aspects and features noted in the foregoing objects.

2. Features of the Disclosure

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.1 to 2.0, or 1.3 to 1.4, or 1.5 to 1.9 eV.

Briefly, and in general terms, the present disclosure provides a method of fabricating a solar cell array module comprising providing a support, providing a face sheet having a top side and an opposite bottom side, mounting the bottom side of the face sheet on the support, dispensing an adhesive area on a plurality of discrete predefined regions on the top side of the face sheet where a string of solar cell assemblies is to be mounted using an machine vision and automatically positioning and mounting an interconnected string of solar cell assemblies on the adhesive area regions on the top side of the face sheet.

In another aspect, the present disclosure provides a method of fabricating a solar cell array module comprising providing a support, providing a face sheet having a top side and an opposite bottom side, mounting the bottom side of the face sheet on the support, dispensing an adhesive area on a plurality of discrete predefined regions on the top side of the face sheet where a string of solar cell assemblies is to be mounted using machine vision and automatically positioning and mounting an interconnected string of solar cell assemblies on the adhesive area regions on the top side of the face sheet.

As used herein, the term "machine vision" can include any or all imaging-based automatic positioning fabrication, inspection and analysis processes such as automatic alignment, mounting, bonding, testing, inspection, process control, and robot guidance. Although conventional (2D visible light) imaging is most commonly used in machine vision, alternatives include imaging various infrared bands, line scan imaging, 3D imaging of surfaces, and X-ray imaging. The most commonly used method for 3D imaging is scanning based triangulation which utilizes motion of the product or image during the imaging process. Other 3D methods used for machine vision are time of flight, grid based, and stereoscopic.

For machine vision, the imaging device (e.g. camera) can either be separate from the main image processing unit of combined with it in which case the combination can be a smart camera or a smart sensor. When separated, the connection may be made to specialized intermediate hardware such as a frame grabber using either a standardized or custom interface. Machine vision can also use digital cameras capable of direct connections (without a frame grabber) to a computer.

Although the vast majority of machine vision applications use two-dimensional imaging, machine vision applications utilizing 3D imaging are also within the scope of the present disclosure. One method is grid array based systems using pseudorandom structured light system. Another method of generating a 3D image is to use laser triangulation, where a laser is projected onto the surfaces of an object and the deviation of the line is used to calculate the shape. In machine vision this is accomplished with a scanning motion, either by moving the workpiece, or by moving the camera and laser imaging system. Stereoscopic vision can be used in special cases involving unique features present in both views of a pair of cameras.

Solar Cells can be prepared by automated reactor process methods of sequentially depositing III-V compound semiconductor layers and other layers (e.g., antireflective coating ARC) on a semiconductor substrate to fabricate a stack of multijunction solar subcells. Such methods that are readily amenable to automation include, for example, metal organic chemical vapor deposition (MOCVD) methods that are readily known in the art. Backside metallization of a solar cell can also be performed, for example, by evaporation or electrodeposition, as well as similar metallization processes on the face sheet or polyimide substrate (e.g., KAPTON®).

In some embodiments, these further comprises applying heat or pressure to bond the interconnected string of solar cell assemblies to the adhesive area regions on the top side of the face sheet.

In some embodiments, the step of dispensing an adhesive area on a plurality of discrete predefined regions on the top side of the face sheet is performed subsequent to the mounting of the bottom side of the face sheet on the support.

In some embodiments, the adhesive area is sized and shaped to match and be congruent to that of a peripheral outline of the respective solar cell assembly to be mounted on the adhesive area.

The step of dispensing an adhesive area utilizes one of a (i) screen printing process; (ii) a spraying process; (iii) a roller application; (iv) a process using a screen or mask over which the adhesive is skived; or (v) a dot, spot, droplet or continuous layer process.

In some embodiments, the step of dispensing an adhesive area utilizes a tool consisting of one of a (i) positive displacement fixture utilizing a piston or air pressure applicator; (ii) spraying process; (iii) a roller; or (iv) a skiving blade.

In some embodiments, the tool is adjustable to accommodate the volumetric amount of adhesive, the area coverage, thickness, uniformity, and degree of underfill of the adhesive area depending upon the physical characteristics of the solar assembly.

In some embodiments, the adhesive area has a thickness in the range of 2.0 to 25 mils.

In some embodiments, the tool for dispensing the adhesive has a single dispensing head and is automatically moved from one adhesive area region to another using machine vision to sequentially apply adhesive to each area region.

In some embodiments, the tool for dispensing the adhesive has a plurality of dispensing heads for simultaneously applying adhesive to a plurality of area regions in a single row or column, and then the tool is automatically moved from that one row or column to the adjacent row or column using machine vision to sequentially apply adhesive to each area region in the that adjacent row or column.

In some embodiments, the face sheet is a flexible film composed of a polyimide.

In some embodiments, the flexible film is composed of a poly (4, 4'-oxydiphenylene-pyromellitimide) material.

In some embodiments, the solar cell assembly is a cover glass-interconnect-solar cell (CIC) assembly in which the multijunction solar cells are III-V compound semiconductor solar subcells.

In some embodiments, the solar cell assembly has a dimension in the range of 100 microns to 3 cm on a side.

In some embodiments, the support is either rigid or flexible and has a thickness of between 25 and 100 microns.

In some embodiments, the bottom side of the face sheet includes a plurality of layers of carbon composite sheets embedded in a matrix of cyanate ester adhesive that is co-cured with the face sheet.

In some embodiments, the adhesive region is composed of an acrylic or a silicone adhesive.

In some embodiments the support is an aluminum honeycomb structure and in some embodiments the assembly process further comprises mounting the aluminum honeycomb structure to the surface of a supporting panel wing, boom or other structure of a satellite or space vehicle.

In some embodiments, the further comprises dispensing discrete predefined adhesive regions on the second side of the support, and mounting the second side of the support on a surface of a supporting panel wing, or boom of a CubeSat.

In some embodiments, the array of solar cell assemblies are automatically interconnected using a pick and place process for positioning the metallic interconnects between adjacent solar cell assemblies followed by automatic parallel gap welding of the interconnects between the solar cell assemblies.

In another aspect, the present disclosure provides a method of fabricating a solar cell array module comprising providing a support, providing a face sheet having a top side and an opposite bottom side, mounting the bottom side of the face sheet on the support, automatically bonding a interconnect member to each of the back sides of a sequence of solar cell assemblies by a sequential parallel gap welding process to provide a series electrical connection between the respective solar cell assemblies to form a string of solar cell assemblies, dispensing an adhesive area on a discrete predefined region on the back side of each of the solar cells in the string using an automated adhesive dispensing process and machine vision, and subsequently automatically positioning and mounting the interconnected string of solar cell assemblies to the top side of the face sheet.

In another aspect the present disclosure provides a method of fabricating a solar cell array module comprising providing a flexible support, providing a face sheet having a top side and an opposite bottom side, mounting the bottom side of the face sheet on the flexible support, subsequently providing a pattern of discrete predefined adhesive regions in an automated manner using machine vision on the top side of the face sheet and rolling the flexible support into a cylindrical shaped roll to permit stowage of the module in a space vehicle prior to deployment of the module in space.

In another aspect the present disclosure provides a solar cell array module comprising a support, a face sheet having a top side and an opposite bottom side, the bottom side of the face sheet being mounted on the support, a pattern of discrete predefined adhesive regions disposed on the top side of the face sheet using machine vision and an array of solar cell assemblies mounted on the adhesive regions on the top side of the face sheet.

In one embodiment, the present disclosure provides a method of fabricating a solar cell array module comprising: providing a release carrier having a sequence of pressure sensitive adhesive (PSA) patches on a first side of the release carrier; contacting the PSA patches on the first side of the release carrier with a first side of a flexible support and under conditions effective to transfer the PSA patches to the first side of the flexible support using an automated process to form discrete predefined PSA regions on the first side of the flexible support; and contacting the PSA regions on the first side of the flexible support with a first side of a release carrier having a sequence of solar cell assemblies thereon under conditions effective to transfer the solar cell assemblies to the PSA regions on the first side of the flexible support using an automated process to attach the sequence of solar cell assemblies to the first side of the flexible support using the PSA regions to prepare a patterned solar cell array. Optionally, the method further includes providing a pressure sensitive adhesive on the second side of the flexible support.

In some embodiments, the release carrier having the sequence of pressure sensitive adhesive (PSA) patches on the first side of the release carrier is provided on a cassette or spool.

In some embodiments, the conditions effective to transfer the PSA patches to the first side of the flexible support comprise: unwinding the release carrier having the sequence of pressure sensitive adhesive (PSA) patches on the first side of the release carrier from the cassette or spool and passing the release carrier through a first automated assembly device in a first direction, wherein the first automated assembly device has two rollers rotating in the same direction; and passing the flexible support through the first automated assembly device in a direction opposite the first direction in which the release carrier passes through the first automated assembly device; wherein the PSA patches on the first side of the release carrier are contacted with a first side of a flexible support and pressure from the two rollers is effective to transfer the PSA patches to the first side of the flexible support to form discrete predefined PSA regions on the first side of the flexible support.

In some embodiments, the release carrier having a sequence of solar cell assemblies on the first side thereof is provided on a cassette, spool, or tray in which each assembly is automatically positioned and moved to align each assembly with the respective adhesive area to which it is to be attached and bonded.

In some embodiments, conditions effective to transfer the solar cell assemblies to the regions on the first side of the flexible support comprise: unwinding the release carrier having the sequence of solar cell assemblies on the first side thereof from the cassette or spool and passing the release carrier through a second automated assembly device in a first direction, wherein the second automated assembly device has two rollers rotating in opposite directions; and passing the flexible support having a pattern of discrete predefined adhesive regions on a first side of the flexible support through the second automated assembly device in the same direction as the first direction in which the release carrier having the sequence of solar cell assemblies on the first side thereof passes through the second automated assembly device; wherein the solar cell assemblies on the first side of the release carrier are contacted with the first side of the flexible support having a pattern of discrete predefined adhesive regions, and pressure from the two rollers is effective to attach the sequence of solar cell assemblies to the adhesive regions on the first side of the flexible support to prepare a patterned solar cell array.

In some embodiments, the adhesive on the second side of the support is patterned such as into intersecting strips. In some embodiments, the pattern of the adhesive on the second side of the support are in the shape of and substantially congruent to the shape of the surface of a space vehicle or satellite. In some embodiments, preparing the pattern of the adhesive on the second side of the support is performed using an automated process and machine vision.

In another embodiment, the present disclosure provides a method of fabricating a solar cell array module comprising: providing an aluminum honeycomb support with a carbon composite face sheet having an array of solar cell assemblies mounted on the face sheet; providing a pattern of discrete predefined adhesive regions on the side of the support opposite the face sheet; and providing a release liner adjacent the discrete predefined adhesive regions on the side of the support opposite the face sheet.

In another aspect, the present disclosure provides a solar cell array module comprising: a support having an array of solar cells mounted on a first side of the support and a pattern of discrete predefined adhesive regions on a second side of the support; and a release liner adjacent the discrete predefined adhesive regions on the second side of the support.

In another aspect, the present disclosure provides a method of mounting a solar cell array module on a space vehicle or satellite comprising: providing a solar cell array module as described herein; removing the release liner; placing the discrete predefined pressure sensitive adhesive (PSA) regions of the solar cell array module adjacent a surface of the space vehicle; and applying pressure (e.g., manually or by an automated process).

In some embodiments, a plurality of solar cells are disposed closely adjacent to one another on each of the strips by a distance between 5 and 25 microns.

In some embodiments, each of the solar cells have a dimension in the range of 0.5 to 10 mm on a side.

In some embodiments of the disclosure, the support is a KAPTON® layer, that is, a polyimide film layer. KAPTON® is a trademark of E.I. du Pont de Nemours and Company. The chemical name for KAPTON® is poly(4,4'-oxydiphenylene-pyromellitimide). Other polyimide film sheets or layers may also be used.

In some embodiments, the support has a thickness of between 25 and 100 microns, or between 1 mil (25.4 µm) and 4 mil (101.6 µm).

In some embodiments, the metal layer is attached to the support layer in an adhesive-less manner, to limit outgassing when used in a space environment.

In some embodiments, a double-faced pressure-sensitive adhesive template or patch is positioned on the backside of the solar cell assembly.

In some embodiments the support is mounted on a metallic honeycomb structure.

In some embodiments, the double-faced pressure-sensitive adhesive template or patch is shaped so that the shape matches and is congruent to that of the peripheral outline of the solar cell assembly.

In some embodiments, the double-faced pressure-sensitive adhesive template or patch and the polyimide film are bonded together by a co-curing process.

In some embodiments, the double-faced pressure-sensitive adhesive template or patch is covered at least partially with a release liner which is removed before making the bonding with the substrate.

In some embodiments, the release liner is at least partially patterned so that it matches the shape of the double-faced pressure-sensitive adhesive template or patch.

In some embodiments the solar cell device and a substrate are automatically bonded together with at least one double-faced pressure adhesive patch, where the at least one double-faced pressure adhesive patch is at least partially positioned on backside of the solar cell device, in particular the interior of the solar cell device and/or at least partially positioned on the substrate before making the bonding connection.

In some embodiments the at least one double-faced pressure sensitive adhesive patch is applied to the substrate, in particular a polymer film, more particular a polyimide film, the shape of the at least one double-faced pressure sensitive adhesive patch patterned to match the shape of the at least one solar cell device.

In some embodiments, the solar cell device is automatically positioned on the substrate so that its shape essentially matches the shape of at least one double-faced pressure sensitive adhesive patch.

In some embodiments, after making the bonding connection at least two solar cell devices are automatically interconnected using a pick and place process for positioning the interconnectors, followed by automatic parallel gap welding.

In some embodiments the at least two solar cell devices are automatically electrically connected, in particular wire bonded together, the at least two solar cell devices having co-planar front-side electrical contacts.

In some embodiments, a single-layer pressure sensitive adhesive (PSA) film is used as a bonding adhesive to attach solar cells or solar cell assemblies to a solar panel.

In some embodiments, the PSA film may be a patterned in discrete areas, or spread as a continuous layer.

In some embodiments, the PSA film may be an acrylic or a silicone adhesive, or any other suitable material.

In some embodiments, the PSA film may have one or two release liners, or possibly no release liners.

In some embodiments, the substrate may be a rigid substrate, such as an aluminum honeycomb substrate with carbon composite face sheet, or it may be a flexible substrate, such as a polyimide film.

In some embodiments, the PSA film may also be applied to the back of the solar cells or solar cell assemblies.

In some embodiments, a pressure sensitive adhesive (PSA) film is prepared as a single layer.

In some embodiments, the PSA film may be prepared onto a permanent flexible substrate, such as a polyimide, with a release liner or liners on the opposite side.

In some embodiments, there may be a multiplicity of individual PSA patterns, each with its own front and back release liners. In some embodiments, there may be a multiplicity of individual PSA patterns, with one single, continuous release liner on one side and a multiplicity of release liners on the opposite side.

In some embodiments, there may be a multiplicity of individual PSA patterns with two continuous release layers covering the multiplicity of patterns on both sides.

In some embodiments, there may be a single, continuous film of PSA with release liners on one or both sides.

In some embodiments, the PSA film is used to bond solar cells or solar cell assemblies to a substrate.

In some embodiments, the PSA film may be applied first to the substrate, and then the solar cells attached to the PSA film, or it may be applied first to the back of the solar cells, and then the solar cells with PSA film are applied to the substrate.

In some embodiments, if the PSA film is prepared on a permanent substrate, the solar cells or solar cell assemblies may be applied directly to the PSA film.

In some embodiments, the PSA film may have continuous release liners that are removed in one step, or it may have a multiplicity of release liners that are removed individually.

In some embodiments, the PSA may be a silicone adhesive, an acrylic adhesive, or any other material that may be suitable for a PSA.

In some embodiments, the PSA may be a patterned layer, or it may be a continuous layer. For instance, the PSA may be patterned into the shape of solar cells.

In some embodiments, the assembly of polyimide-PSA-release liner is bonded directly to a solar panel substrate by co-curing the polyimide film to the face of the solar panel substrate. The solar panel substrate to which the polyimide is bonded may be an aluminum honeycomb substrate, and it may have a carbon composite or aluminum face sheet. It may be a rigid substrate, or it may be a flexible substrate.

In some embodiments, following the above described assembly, the substrate is ready to have the solar cells or solar cell assemblies bonded to it. The release liner is removed when it is time to bond the solar cells, which exposes the PSA, and the solar cells are bonded to the PSA and the substrate. Since the PSA thickness is precisely controlled during manufacturing, the bondline is uniform and there is less opportunity to entrap air than when a liquid adhesive is used.

In another aspect, the present disclosure provides a space vehicle and its method of fabrication comprising: a payload disposed on or within the space vehicle; and a power source for the payload, including an array of solar cell assemblies mounted on a panel, each solar cell assembly being of the type described above.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures.

DESCRIPTION OF ILLUSTRATIVE EMBODIMENTS

Figure 1A:
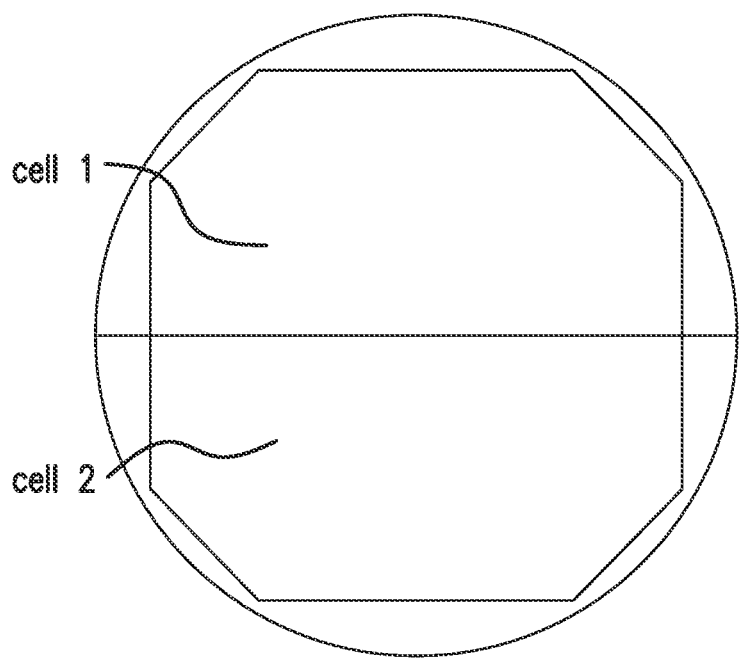
FIG. 1A is a top plan view of a wafer with two solar cells being implemented.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells are disclosed in the related applications noted above. Some, many or all of such features may be included in the structures and processes associated with the solar cells of the present disclosure. However, more particularly, the present disclosure is directed to several embodiments of mounting a plurality of solar cells to a support.

More generally, however, the present disclosure may be adapted to multijunction solar cells as disclosed in related applications that may include three, four, five, or six subcells, with band gaps in the range of 1.8 to 2.2 eV (or higher) for the top subcell; 1.3 to 1.8 eV and 0.9 to 1.2 eV for the middle subcells; and 0.6 to 0.8 eV for the bottom subcell, respectively.

The present disclosure provides a process for the design and fabrication of an array of covered-interconnect-cells or "CICs" using multijunction solar cells that improve manufacturing efficiency and/or performance. More specifically, the present disclosure intends to provide a relatively simple and reproducible technique that is suitable for use in a high volume production environment in which various semiconductor layers are deposited in an MOCVD reactor, and subsequent processing steps are defined and selected to minimize any physical damage to solar cell and the quality of the deposited layers, thereby ensuring a relatively high yield of operable solar cells meeting specifications at the conclusion of the fabrication processes.

FIG. 1A is a top plan view of a wafer with two solar cells (cell 1 and cell 2) being implemented. Such solar cells may be referred to as "half-wafer" or "two-fer" cells.

Figure 1B:
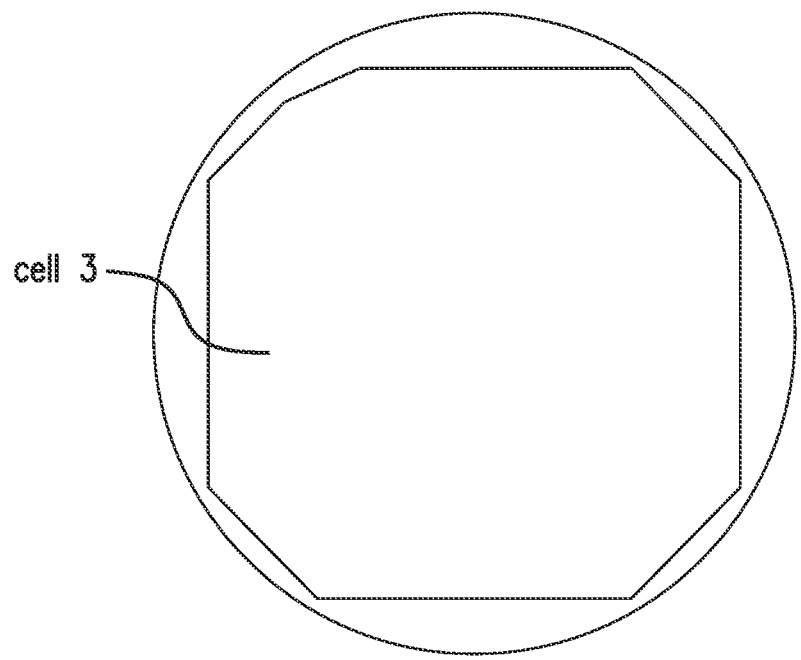
FIG. 1B is a top plan view of a wafer with a single solar cell being implemented.

FIG. 1B is a top plan view of a wafer with a single solar cell (cell 3) being implemented.

Figure 2:
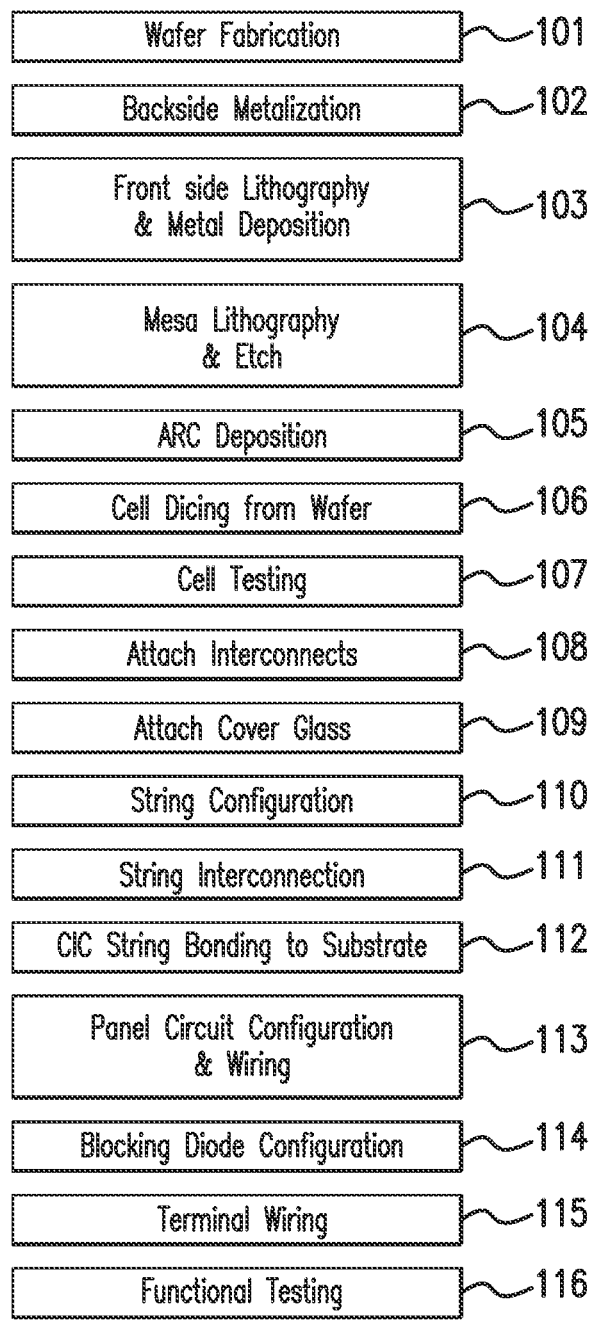
FIG. 2 is a listing of the sequence of steps in fabricating a solar cell and attaching it to a panel.

FIG. 2 is a flowchart representing a method in accordance with an embodiment of the present disclosure. Certain embodiments of the invention can include one or more of the method steps of wafer fabrication (101), backside metallization (102), front side lithography and metal deposition (103), mesa lithography and etch (104), antireflective coating (ARC) deposition (105), cell dicing from the wafer (106), cell testing (107), attaching interconnects and configuring and attaching bypass diodes (108), attaching cover glass to form CIC (109), forming string configuration (110), forming string interconnections (111), CIC string bonding to substrate (112), panel circuit configuration and wiring (113), blocking diode configuration (114), terminal wiring (115), and functional testing (116).

In certain embodiments of the present disclosure, one or more of the above-recited method steps may be performed using an automated process using machine vision.

Solar cell configurations particularly suitable for assembly using automated processes include those that are described in U.S. patent application Ser. No. 14/592,519, filed Jan. 8, 2015; Ser. No. 14/719,111, filed May 21, 2015; Ser. No. 14/729,412, filed Jun. 3, 2015; and Ser. No. 14/729,422, filed Jun. 3, 2015, all of which are incorporated herein by reference in their entireties.

One or more solar cells can be formed from a wafer using conventional techniques such as dicing or scribing. The size and shape of the solar cells can be varied as desired for particular applications as disclosed, for example, in U.S. patent application Ser. No. 14/592,519, filed Jan. 8, 2015, which is incorporated herein by reference in its entirety. Dicing or scribing of solar cells from a wafer into mosaic elements is particularly amenable to automation using machine vision, and then aligning and arranging the mosaic elements into a rectangular CIC assembly, such as disclosed in U.S. patent application Ser. No. 16/410,904 filed May 13, 2019, hereby incorporated by reference.

Figure 3:
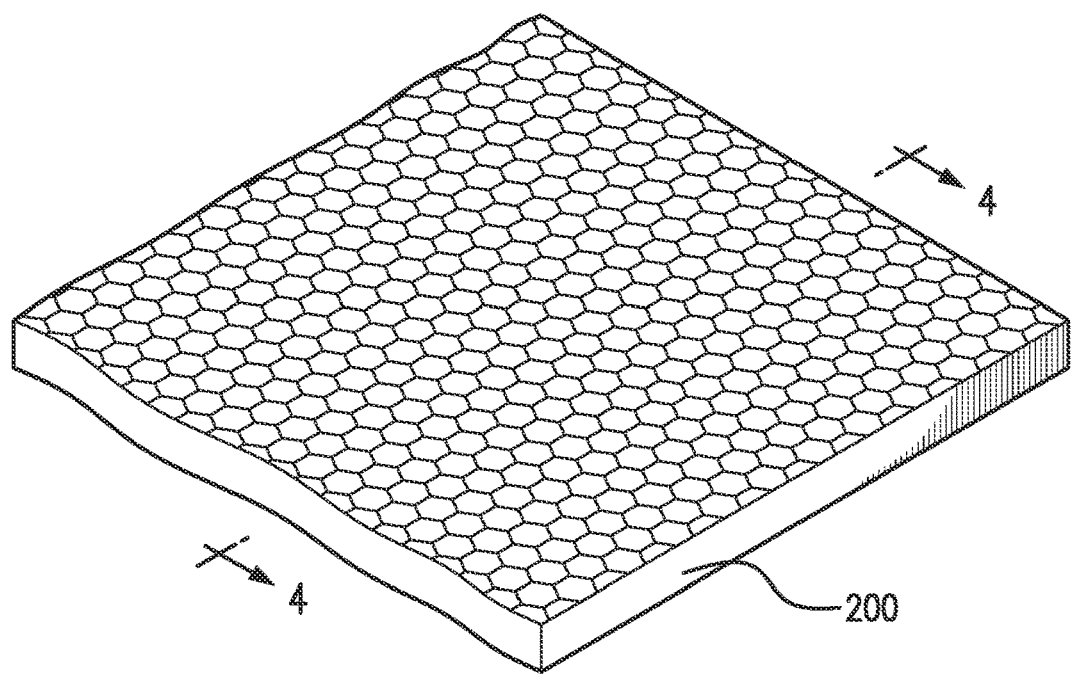
FIG. 3 is a perspective view of a honeycomb support of a panel.

FIG. 3 is a perspective view of a metallic honeycomb structure 200 which can be used as the support for the face sheet on which the solar cell assemblies are mounted.

Figure 4:
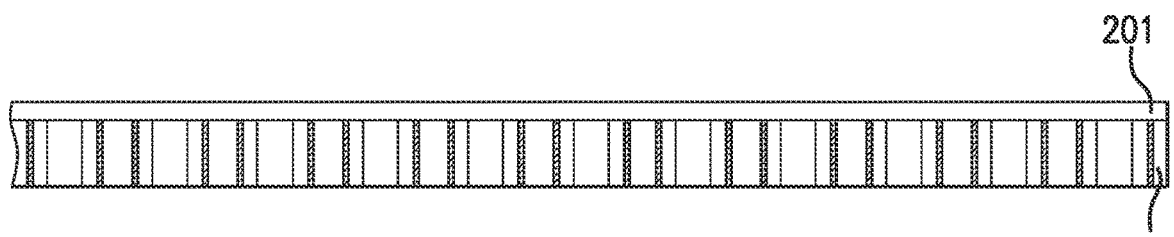
FIG. 4 is a cross-sectional view of a honeycomb panel of FIG. 3 with a carbon fiber face sheet.

FIG. 4 is a cross-sectional view of an aluminum honeycomb substrate 200 with carbon composite face sheet 201 attached thereto. In some embodiments, a double sided adhesive film can be positioned on the top surface of the face sheet, and the bottom surface of the adhesive film can be bonded to the top surface of the face sheet by, for example, co-curing. In some embodiments, a plurality of layers of carbon composite sheets can be embedded in a matrix of cyanate ester adhesive. The polyimide can then be put on top and the whole stack co-cured.

In some embodiments, a sequence of solar cell assemblies can be positioned over the top surface of the adhesive film, and each of the sequence of solar cell assemblies can be sequentially bonded to a predefined region on the top surface of the adhesive film, for example, by automatic application of pressure and/or heat. In some embodiments, the predefined region contains a pressure sensitive adhesive, and no adhesive is present on other regions of the top surface of the face sheet.

Figure 5:
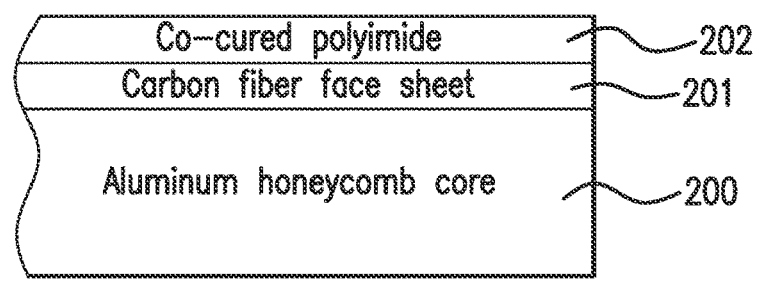
FIG. 5 is a cross-sectional view of the support assembly of FIG. 4 with a polyimide surface layer.

FIG. 5 is a cross-sectional view of one embodiment of an aluminum honeycomb substrate 200 with carbon composite face sheet 201 attached to aluminum honeycomb substrate 200, and co-cured polyimide substrate 202 attached to carbon composite face sheet 201.

Figure 6:
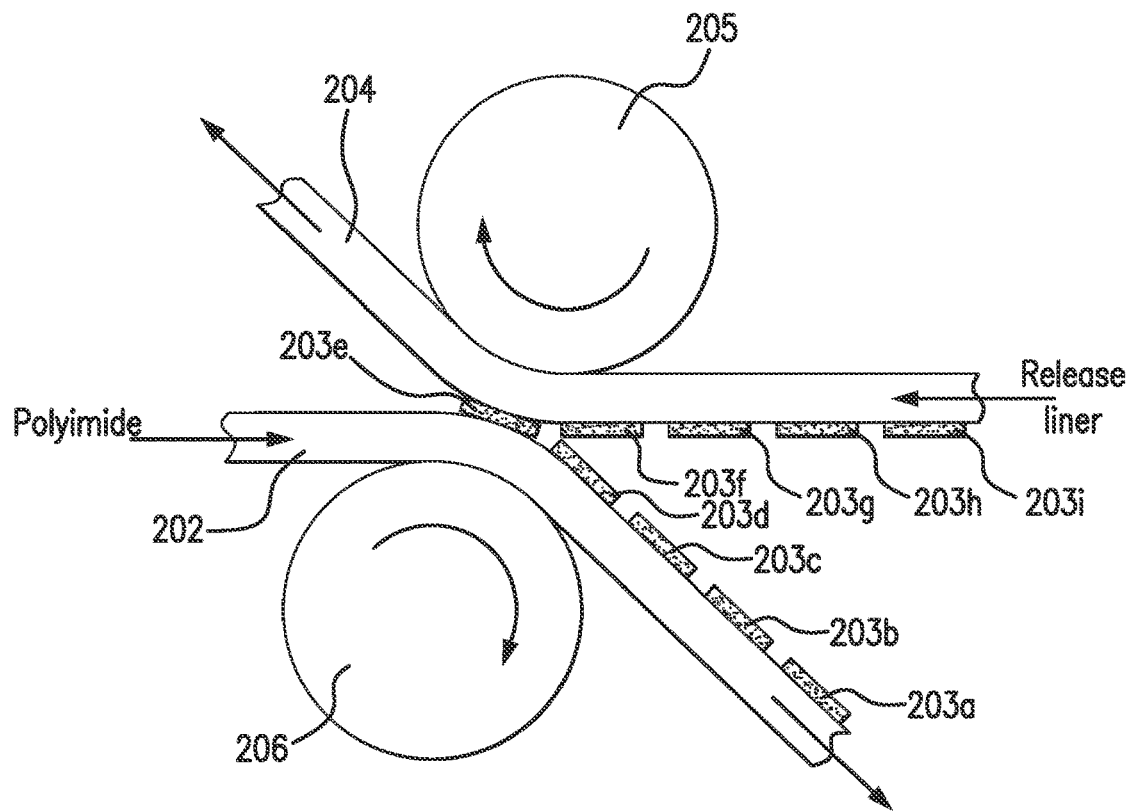
FIG. 6 is a cross sectional view of an assembly for applying the patterns of PSA patches to a polyimide sheet in an automated manner.

FIG. 6 is a cross sectional view of one embodiment of an assembly for applying patterns of PSA patches to a polyimide sheet in an automated manner. A sequence of PSA patches 203*e*, 203*f*, 203*g*, 203*h*, 203*i*, . . . are disposed on a first side of release carrier 204. The PSA patches 203*e*, 203*f*, 203*g*, 203*h*, 203*i*, . . . are placed in contact with a first side of polyimide sheet 202. A second side of release carrier 204 is in contact with roller 205, and a second side of polyimide sheet 202 is in contact with roller 206. Rollers 205 and 206 are rotating in the same direction (i.e., both either clockwise or counter-clockwise), which causes release carrier 204 and polyimide sheet 202 to be transported between rollers 205 and 206 in opposite directions. As release carrier 204 and polyimide sheet 202 pass through rollers 205 and 206, PSA patches 203*e*, 203*f*, 203*g*, 203*h*, 203*i*, . . . each come in contact with the first side of polyimide sheet 202. Rollers 205 and 206 can exert sufficient pressure on polyimide sheet 202 and release liner 204 to cause each PSA patch to be automatically transferred from the first side of release liner 204 and sequentially positioned on the first side of polyimide film 202 as shown for PSA patches 203d, 203c, 203b, and 203a.

Figure 7:
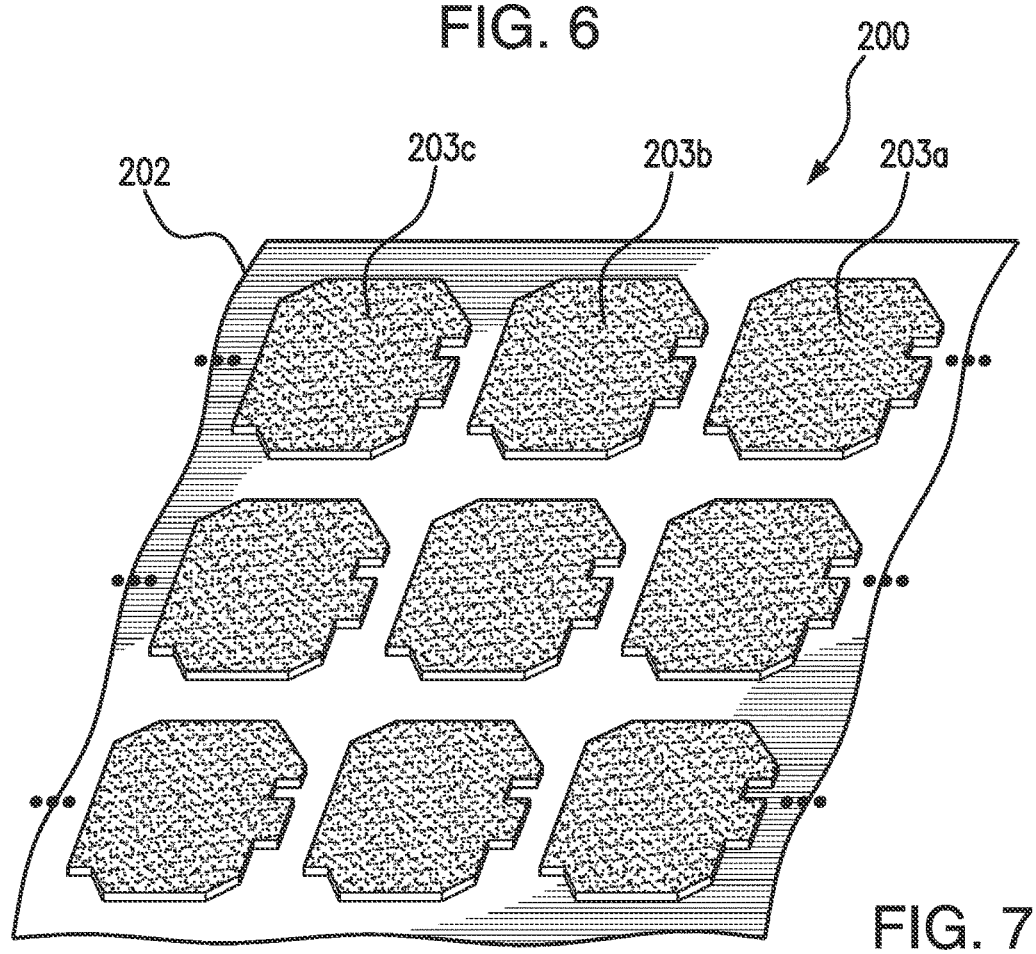
FIG. 7 is a perspective view of a pattern of PSA templates or patches on the surface of the polyimide sheet after attachment by the assembly of FIG. 6.

FIG. 7 is a perspective view of one embodiment of substrate 200 having a pre-selected pattern of PSA templates or patches 203a, 203b, 203c, . . . on pre-determined regions of the surface of polyimide face sheet 202 after attachment by the assembly of FIG. 6.

Figure 8:
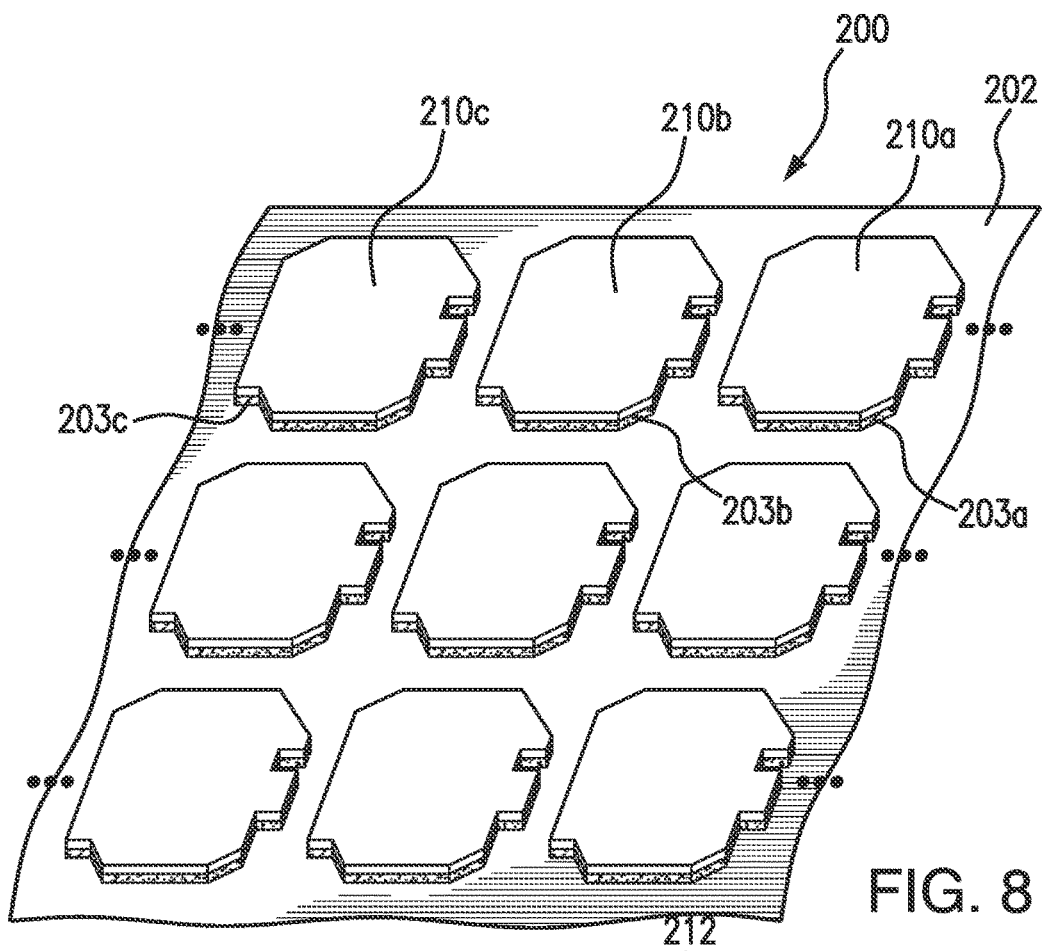
FIG. 8 is a perspective view of an array of solar cells mounted on the PSA templates or patches depicted in FIG. 7.

FIG. 8 is a perspective view of one embodiment of an array of solar cells 210a, 210b, 210c, . . . mounted on the PSA templates or patches 203a, 203b, 203c, . . . , respectively, as depicted in FIG. 7. The array of solar cells 210a, 210b, 210c, . . . can be mounted on the PSA templates or patches 203a, 203b, 203c, . . . , respectively, by a wide variety of methods. For example, the sequence of solar cell assemblies 210a, 210b, 210c, . . . can be disposed on a release carrier, and each solar cell assembly 210a, 210b, 210c, . . . can be detached from the release carrier as the solar cell assembly is bonded to a respective PSA template or patch 203a, 203b, 203c, . . . in a predefined region of polyimide face sheet 202 of substrate 200.

Figure 9:
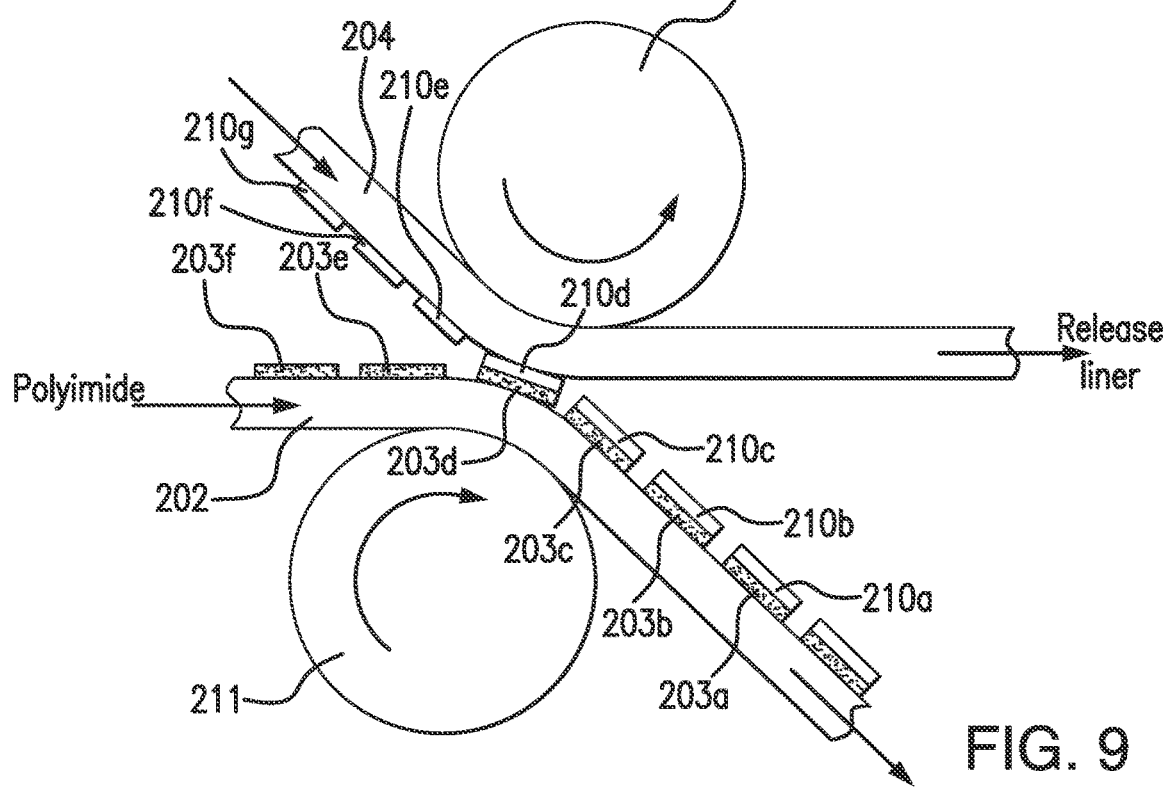
FIG. 9 is a cross sectional view of an automated assembly process for mounting the solar cells on the patterns of PSA patches attached to the polyimide sheet.

FIG. 9 is a cross sectional view of one embodiment of an automated assembly process for mounting the solar cell assemblies on patterns of PSA patches attached to a polyimide sheet. A sequence of solar cell assemblies 210d, 210e, 210f, 210g, . . . are disposed on a first side of release carrier 204. The PSA patches 203a, 203b, 203c, 203d, 203e, 203f, . . . disposed in predefined regions on a first side of polyimide sheet 202 are placed in contact with the sequence of solar cell assemblies 210d, 210e, 210f, 210g, . . . disposed on a first side of release carrier 204. A second side of release carrier 204 is in contact with roller 212, and a second side of polyimide sheet 202 is in contact with roller 211. Rollers 211 and 212 are rotating in the opposite directions (i.e., one clockwise and the other counter-clockwise), which causes release carrier 204 and polyimide sheet 202 to be transported between rollers 211 and 212 in the same direction. As release carrier 204 and polyimide sheet 202 pass through rollers 211 and 212, PSA patches 203a, 203b, 203c, 203d, 203e, 203f, . . . on polyimide sheet 202 each come in contact with solar cell assemblies 210d, 210e, 210f, 210g, . . . disposed on release carrier 204. Rollers 211 and 212 can exert sufficient pressure on polyimide sheet 202 and release liner 204 to cause each solar assembly to be automatically transferred from the first side of release liner 204 and sequentially positioned on PSA patches 203a, 203b, 203c, 203d, 203e, 203f, . . . on the first side of polyimide sheet 202 as shown for solar cell assemblies 210a, 210b, 210c, and 210d adhered to PSA patches 203a, 203b, 203c, and 203d, respectively, on pre-determined regions of the first side of polyimide sheet 202.

Figure 10:
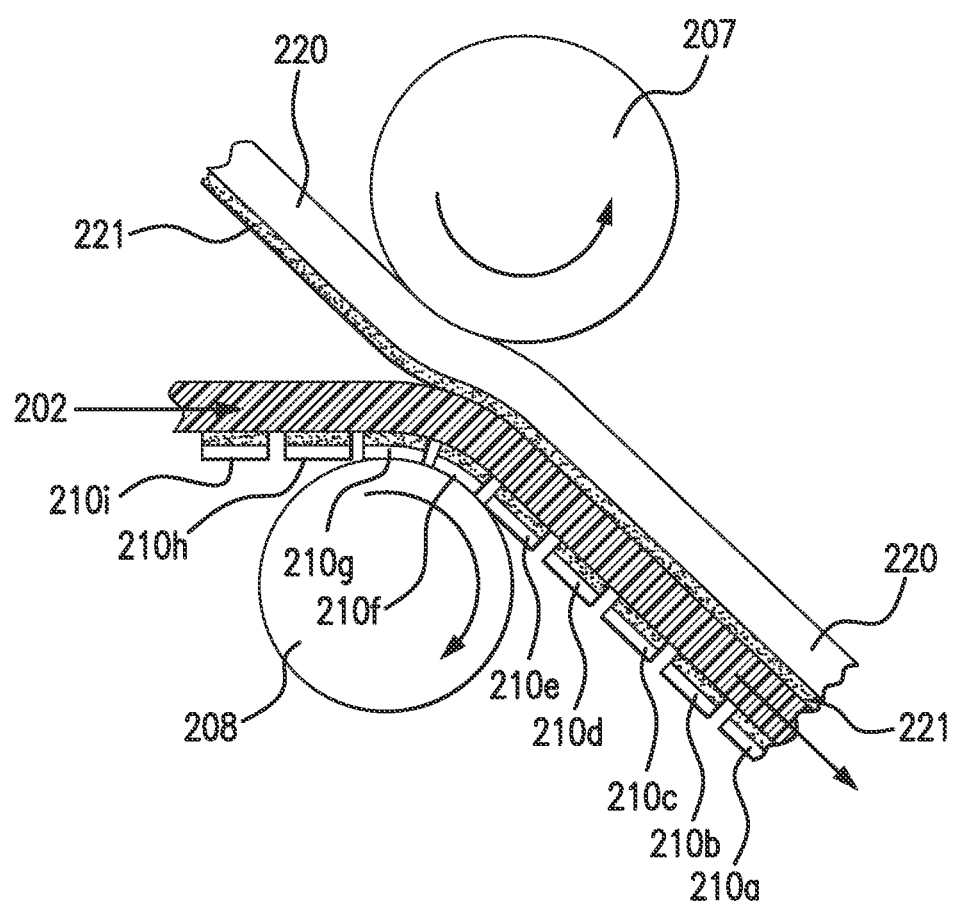
FIG. 10 is a cross sectional view of an automated assembly process for applying a PSA/release liner construction on the side of the polyimide sheet having solar cells mounted thereon.

FIG. 10 is a cross sectional view of one embodiment of an automated assembly process for applying the PSA 221/release liner 220 construction on the side of polyimide sheet 202 opposite solar cell assemblies 210a, 210b, 210c, 210d, 210e, 210f, 210g, 210h, 210i, . . . . In some embodiments, PSA 221 may be a continuous layer adjacent release liner 220. In some other embodiments, PSA 221 may be a patterned layer adjacent release liner 220. The side of the polyimide sheet 202 having solar cell assemblies 210a, 210b, 210c, 210d, 210e, 210f, 210g, 210h, 210i, . . . attached thereto is in contact with roller 208. The side of release liner 220 opposite the side having PSA 221 attached thereto is in contact with roller 207. Rollers 207 and 208 are rotating in opposite directions (i.e., one clockwise and the other counter-clockwise), which causes polyimide sheet 202 and the release liner 220/PSA 221 construction to be transported between rollers 207 and 208 in the same direction. As polyimide sheet 202 and the release liner 220/PSA 221 construction pass through rollers 207 and 208, PSA 221 comes in contact with the side of polyimide sheet 202 opposite solar cell assemblies 210a, 210b, 210c, 210d, 210e, 210f, 210g, 210h, 210i, . . . . Rollers 207 and 208 can exert sufficient pressure on polyimide sheet 202 and the release liner 220/PSA 221 construction to adhere PSA 220 to polyimide sheet 202.

In some embodiments, the solar cell assemblies may have a substantially square or rectangular shape with a dimension (width and/or length) of about 100 m to 3 cm, in some embodiments, 500 m to 1 cm, in some embodiments, 1 mm to 5 mm. In other words, the solar cell may have an area of about 0.01 mm$^2$ to 9 cm$^2$, in some embodiments, about 0.25 mm$^2$ to 1 cm$^2$, in some embodiments, about 1 mm$^2$ to 25 mm$^2$. The MIC (the module including an array of cells mounted on a sheet or a support) may have dimensions of about 25 mm by 25 mm to about 600 mm by 600 mm. In some embodiments, the MIC may be about 50 mm by 50 mm to 300 mm by 300 m. In some embodiments, the MIC may be 100 mm by 100 mm to 200 mm by 200 mm.

In other words, in some embodiments of the disclosure the module may have an area of about 600 mm$^2$ to 3600 cm$^2$, in some embodiments about 25 cm$^2$ to 900 cm$^2$, in some embodiments 100 cm$^2$ to 400 cm$^2$.

In one embodiment, it is possible to reduce the amount of waste and at the same time achieve a high fill factor by dividing a circular or substantially circular wafer not into one single rectangular, such as square, cell, but into a large number of smaller cells. By dividing a circular or substantially circular wafer into a large amount of relatively small cells, such as rectangular cells, most of the wafer material can be used to produce solar cells, and the waste is reduced. For example, a solar cell wafer having a diameter of 100 mm or 150 mm and a surface area in the order of 80 cm$^2$ or 180 cm$^2$ can be used to produce a large amount of small solar cells, such as square or rectangular solar cells each having a surface area of less than 9 cm$^2$, less than 1 cm$^2$, less than 0.1 cm$^2$ or even less than 0.05 cm$^2$ or less than 0.01 cm$^2$. For example, substantially rectangular—such as square-solar cells can be obtained in which the sides are less than 30, 10, 5, 3, 2, 1 or even 0.5 mm long. Thereby, the amount of waste of wafer material can be substantially reduced, and at the same time a high fill factor can be obtained.

Figure 11:
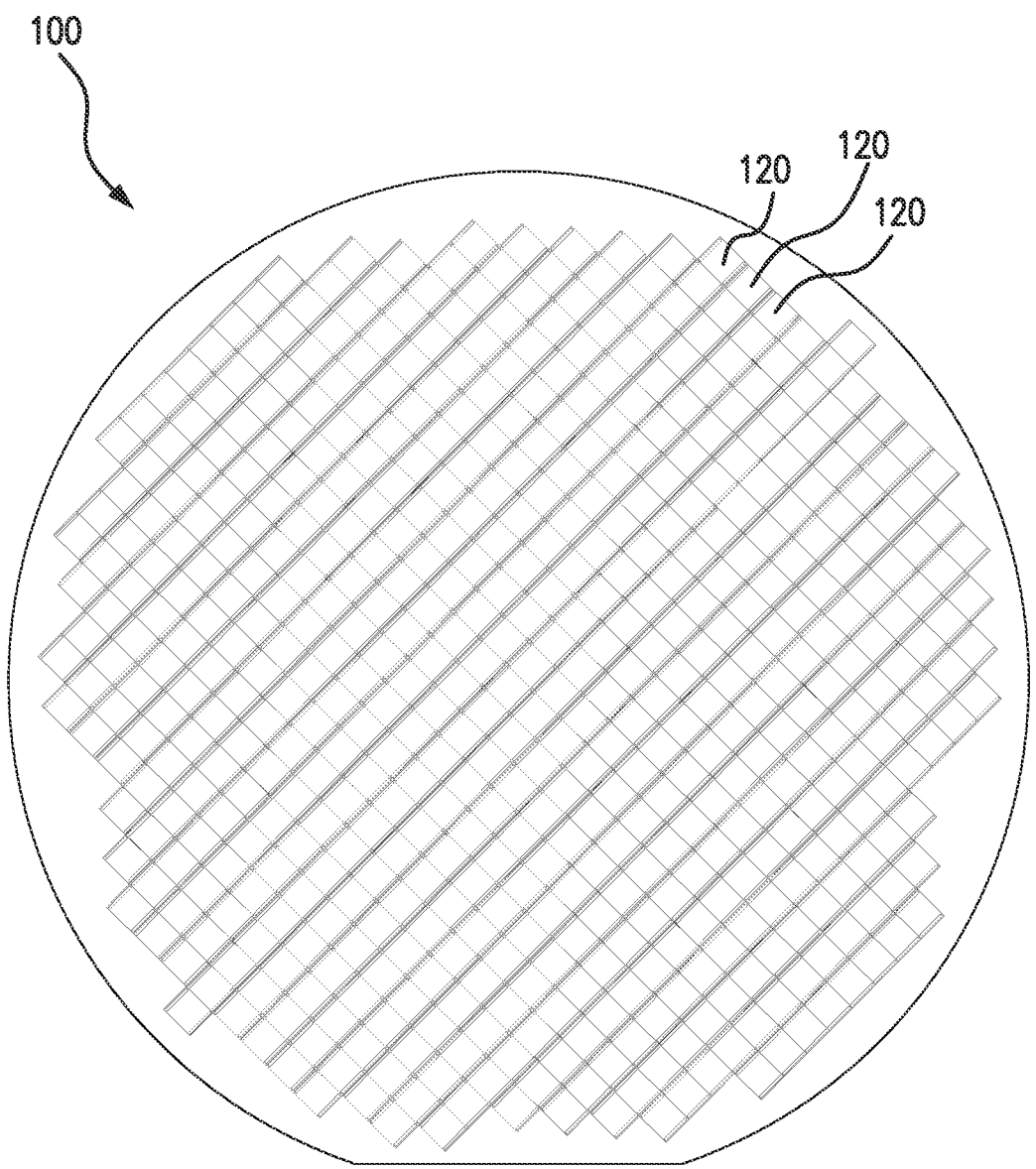
FIG. 11 is a plan view illustrating small solar cell dies cut out from a wafer according to an embodiment of the present disclosure.

FIG. 11 is a plan view illustrating dies 120 with relatively small areas being defined to be diced or cut out from a wafer 100 according an embodiment of the present disclosure. The solar cells 120 may each have an area as described above, for example, of about 0.1 mm$^2$ to about 100 mm$^2$. As shown, the wasted area of the wafer 100 which cannot be used to fabricate solar cells 120 is significantly reduced compared to other known methods. Specifically, the wafer utilization may be from 88% to 95%. Also, solar cells 120 corresponding to a defective region of the wafer can easily be discarded so as not to impair the performance of the module produced from the solar cells.

Figure 12:
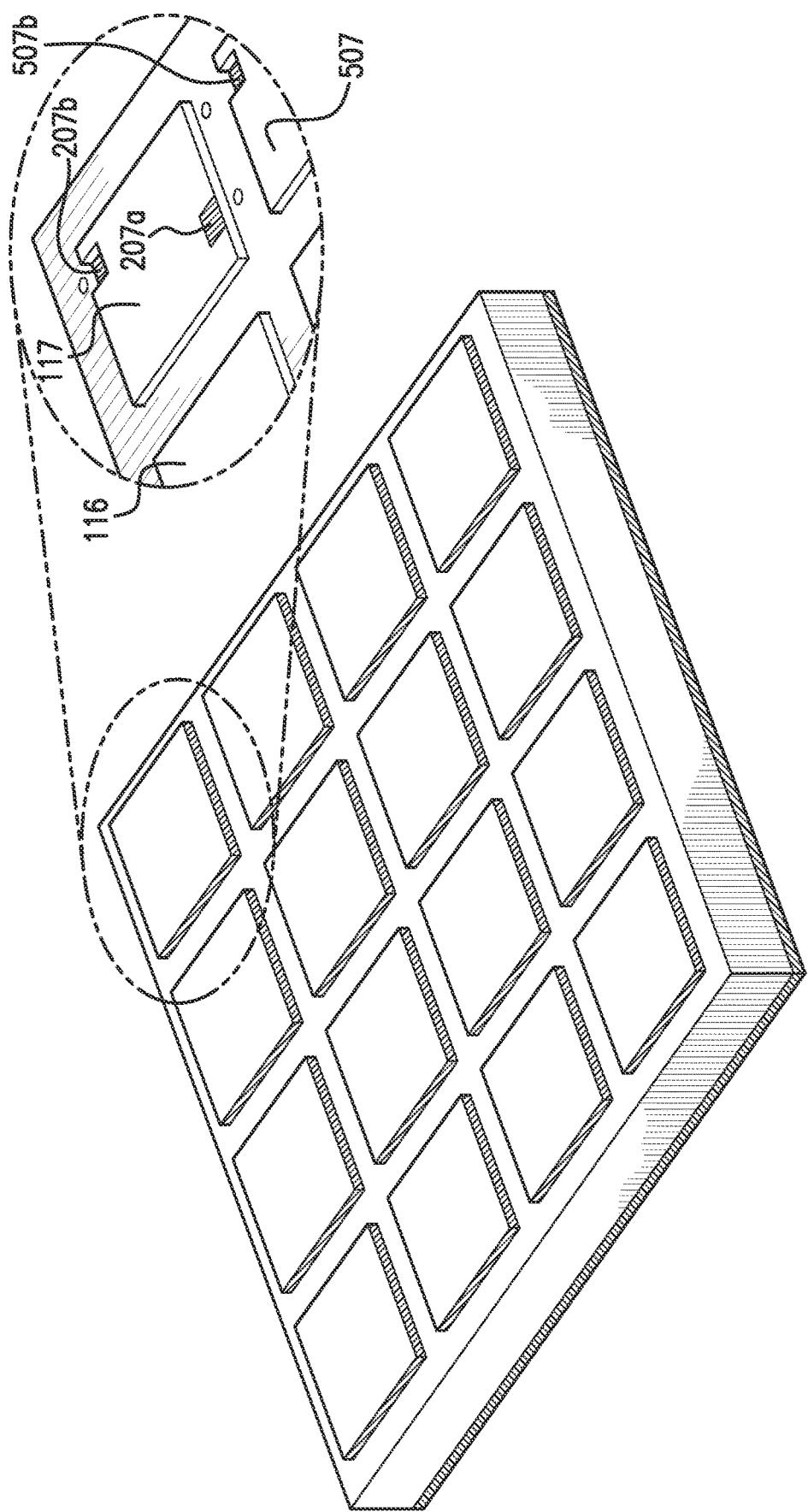
FIG. 12 is a top perspective view of a module with an array of solar cells mounted on a surface.

FIG. 12 is a top perspective view of a module with an array of solar cells 116, 117, . . . and 507 mounted on the surface of the first side of a support. In the enlarged portion, a contact 207a of the first polarity type and two contacts 207b, 507b of the second polarity type of are shown in relation to two solar cells 117, 507. The solar cells can be conveniently be electrically connected using interconnects as described, for example, in U.S. patent application Ser. No. 14/833,755, filed Aug. 24, 2015.

Figure 13:
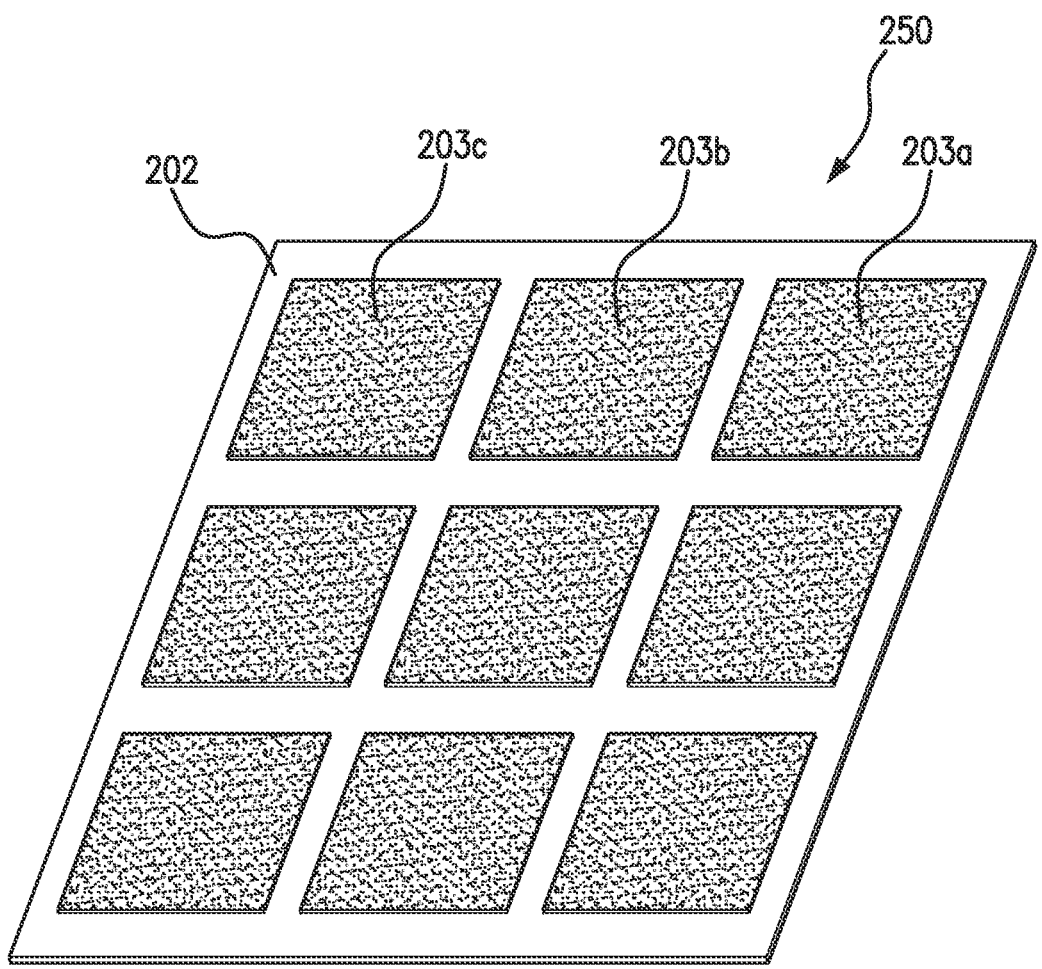
FIG. 13 is a perspective view of a solar cell module with a polyimide sheet having a pattern of PSA patches on the side of the polyimide sheet opposite the solar cells attached thereto.

FIG. 13 is a perspective view of solar cell module 250 with polyimide sheet 202 having a pattern of PSA patches 221a, 221b, and 221c on the side of polyimide sheet 202 opposite solar cells 203a, 203b, and 203c, which can be prepared, for example, as described for FIG. 10. In FIG. 13, release liner 220 has been removed to reveal a pattern of PSA patches.

Polyimide sheets having PSA and a release liner on the side of polyimide sheet opposite the solar cells can conveniently be used to attach the solar cell module to a space vehicle or satellite. For example, the release liner can be removed and the solar cell module can be attached to the surface of the space vehicle or satellite by the application of pressure, either manually or automatically.

CubeSats are a type of miniaturized space vehicles or satellites. A typical CubeSat is a 10 cm×10 cm×10 cm cube, thus having a volume of one liter. CubeSats can be attached to one another in strings or blocks to provide functionalities and capabilities that would not otherwise be practically available in a single CubeSat. For example, one CubeSat can be used as a power source to supply power necessary for other attached CubeSats to perform their functions such as imaging, sensing, or communications.

The solar cell array modules described herein can be particularly advantageous for attaching to a CubeSat. For example, the solar cell module can be attached directly to the surface of the CubeSat without a need for a frame (e.g., an aluminum frame). Further the solar cell modules can include a light weight flexible support (e.g., polyimide support) or a non-flexible support (egg shell support).

Figure 14:
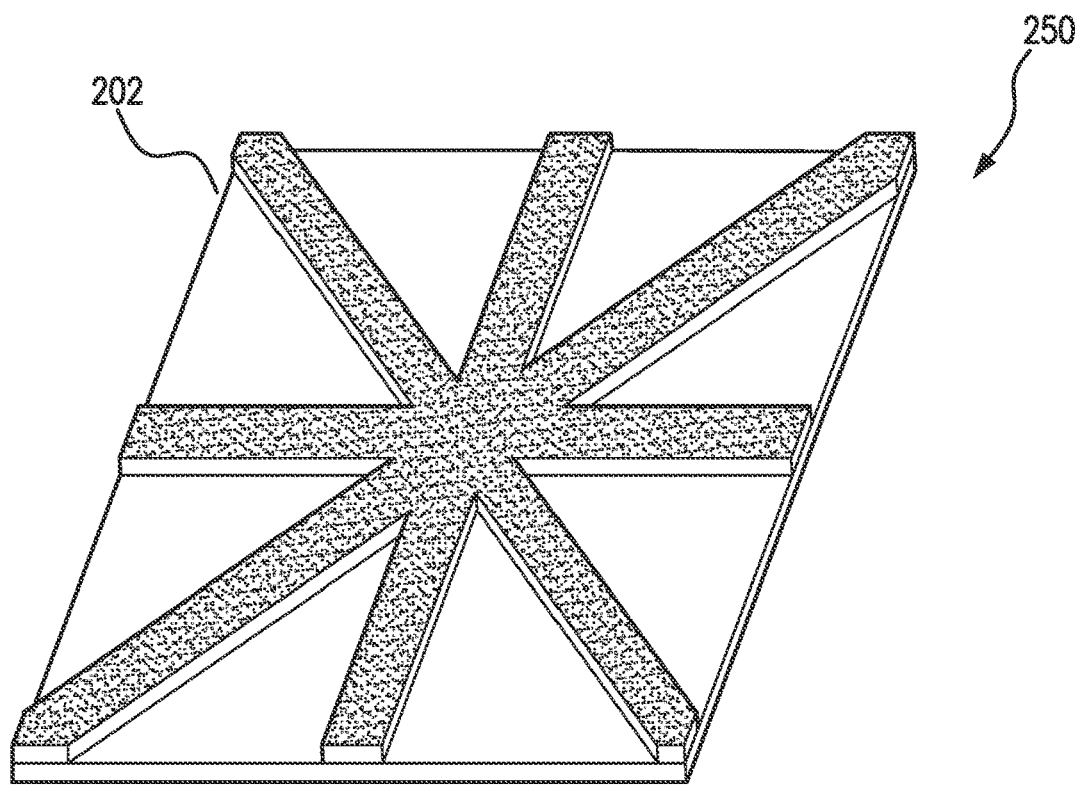
FIG. 14 illustrates an exemplary perspective view of solar cell module having a patterned PSA layer on the polyimide sheet.
Figure 15:
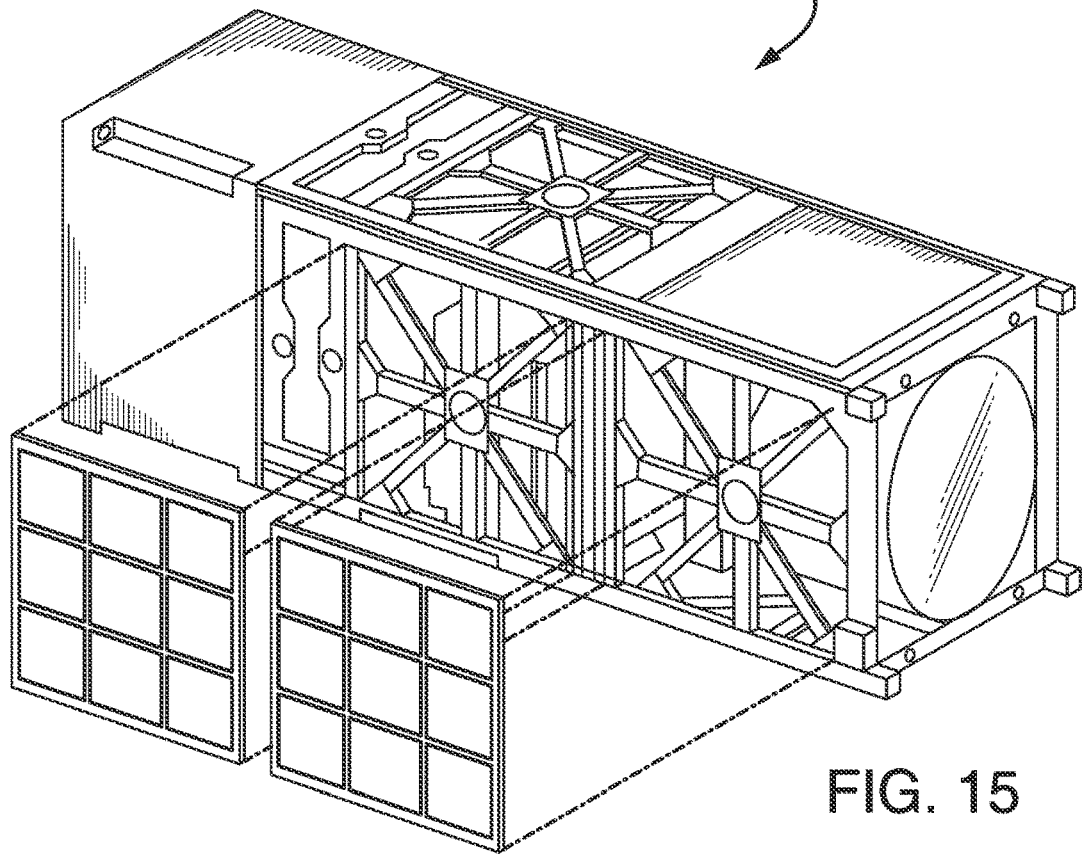
FIG. 15 is a perspective view illustrating mounting the solar cell modules of FIG. 14 on a CubeSat.

The PSA on the polyimide sheets can be a continuous layer or a patterned layer designed for a particular application. For example, FIG. 14 illustrates an exemplary perspective view of solar cell module 250 having a patterned PSA layer on polyimide sheet 202. The particular pattern 221d for the PSA in FIG. 14 is designed to match the framework on the surface of a CubeSat 1000 as illustrated in FIG. 15.

The next group of Figures are directed to the automated process for bonding a string of solar cell assemblies to the polyimide face sheet, face sheet to the support, and finally the support to the space vehicle, according to the present disclosure.

Figure 16:
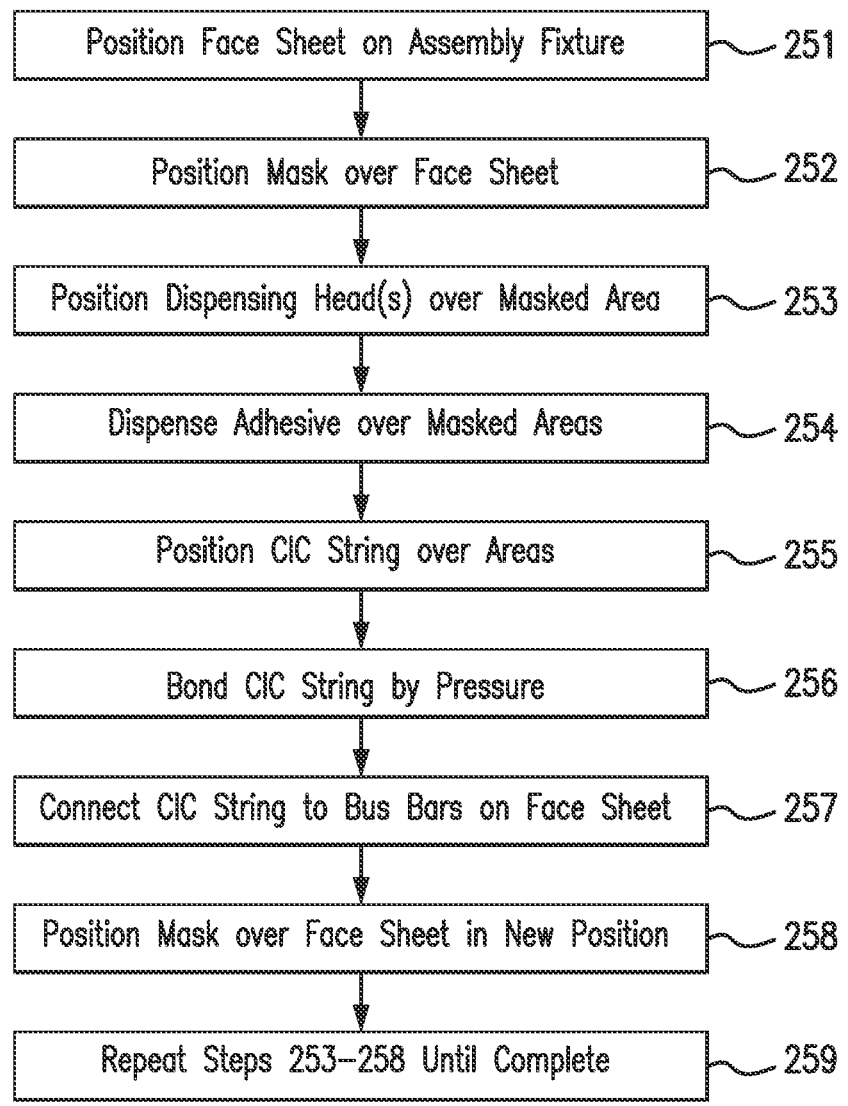
FIG. 16 is a flow chart describing the sequence of steps for attaching a CIC to a face sheet and the face sheet to a panel.
Figure 17A:
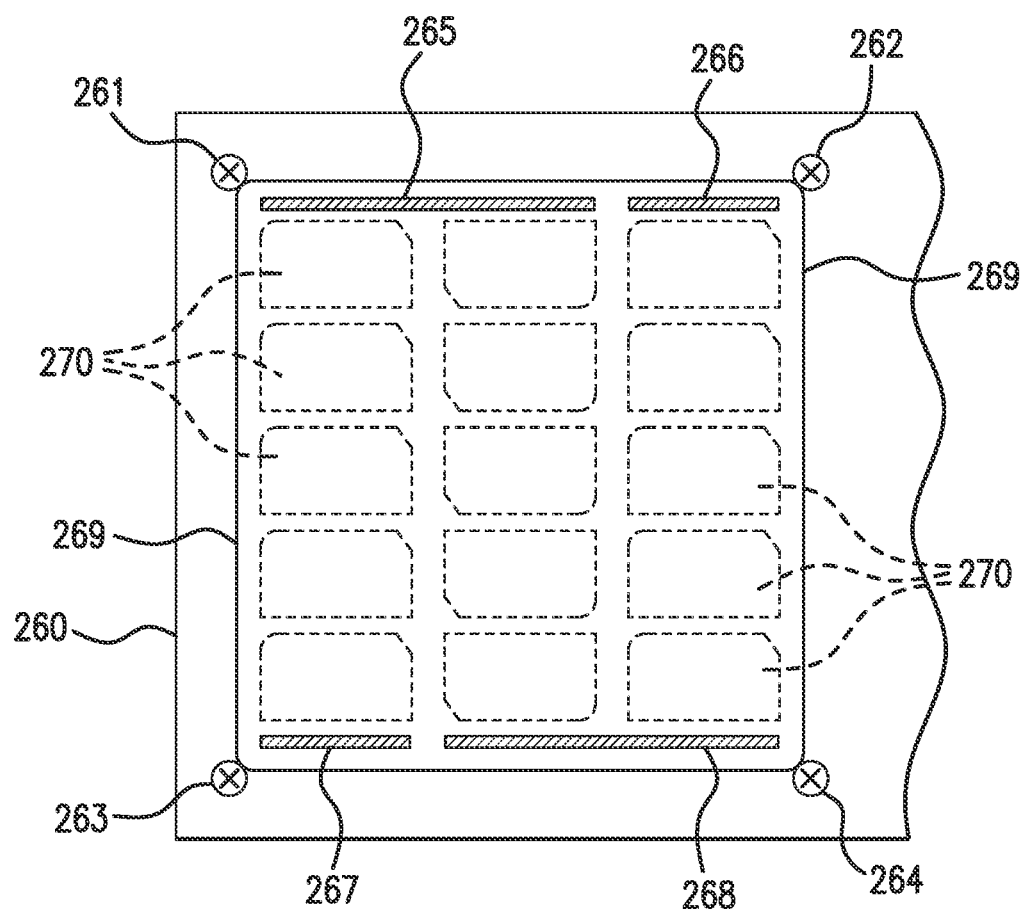
FIG. 17A is a top plan view of a face sheet for supporting an array of solar cell assemblies (or CICs) to be mounted on the face sheet positioned on an assembly fixture with the dashed lines indicating the regions on the face sheet where the solar cell assemblies are to be mounted.

FIG. 16 is a flow chart describing the sequence of steps for attaching a CIC to a face sheet and the face sheet to a panel. Although a CIC with a "two-fer" solar cell as in FIG. 1A is illustrated in FIG. 17A et seq., more complex CIC assemblies such as depicted in U.S. patent application Ser. No. 16/410,904 filed May 13, 2019 are contemplated within the scope of the present disclosure. The process step set forth in Block 112 of FIG. 2 describes the CIC bonding to the substrate. The present disclosure elaborates that generic single process step with the more specific sub-sequence of process steps set forth in the sequence of blocks depicted in the flow chart of FIG. 16 and more pictorially illustrated in FIG. 17A et seq. depicting an embodiment of the fixtures utilized for performing such operations.

In the first process step 251 illustrated in FIG. 16 the face sheet 269 is transported and positioned on a fixture by machine vision to enable subsequent automated operations to take place on the top surface of the face sheet 269, (the reference numbers corresponding to elements depicted in FIG. 17A et seq.).

In the next process step 252, a mask 290 is deployed and positioned by machine vision using fiducial marks 261, 262, 263 and 264 disposed over the surface of the face sheet 269 or more fiducial marks may be employed on the top of the face sheet 269 to assist in the machine vision process, as well as on the top of the mask to assist in the machine vision process.

In the next process step 253, an adhesive dispensing head is aligned and positioned over the mask using machine vision, in some embodiments making use of the fiducial marks 261, 262, 263, 264 disposed on the top surface of the face sheet 269.

In the next process step 254, the adhesive is dispensed over the masked area(s).

In the next process step 255, a CIC string is aligned and positioned over the face sheet using machine vision, in some embodiments making use of the fiducial marks 261, 262, 263, 264 on the top surface of the face sheet, with the individual CICs being positioned over the respective adhesive areas to which they are to be attached.

In the next process step 256, the CIC string is bonded to the top surface of the face sheet using pressure or heat, or both, by a component 304 associated with the dispensing head.

In the next process step 257, the CIC which has been bonded to the face sheet is electrically coupled by metal interconnect to a bus bar 265 and 267 on the face sheet, in some embodiments making use of the fiducial marks on the top surface of the face sheet.

In the next sequence of process steps another column of CICs are to be attached to the face sheet 269, and in the illustrated example of step 258, the mask 290 is aligned and positioned over the second column using machine vision, in some embodiments making use of the fiducial marks on the top surface of the face sheet.

In process step 259, the steps 253-258 are repeated as successive strings of CICs are aligned, positioned, and bonded to the face sheet, connected to bus bars, until the panel is completed.

In FIG. 17A is a top plan view of an assembly fixture 260 for supporting a face sheet 269 positioned thereon for supporting an array of solar cell assemblies (or CICs) to be mounted on the face sheet, the view defining a pattern of discrete adhesive regions 270 (shown in dashed line outlines) on the top surface of the face sheet 269 where the solar cell assemblies are to be mounted during the fabrication process.

The assembly fixture 260 includes fiducial marks 261, 262, 263, and 264 on the top surface thereof for the positioning of the face sheet 269 by a machine vision apparatus during the automated assembly process.

The face sheet 269 also includes a plurality of conductive traces 265, 266, 267 and 268 deposited along the peripheral sides on the top surface thereof to permit conductive paths to be made between the individual strings of the solar cell assemblies to be mounted on the face sheet, or to allow external electrical contact to be made to the array supported on the face sheet.

The fabrication of face sheets with conductive traces thereon and the patterns and uses of the conductive traces are described in U.S. patent application Ser. No. 15/868,296 filed Jan. 11, 2018, now U.S. Pat. No. 10,790,406 and Ser. No. 14/719,111 filed May 21, 2015, now U.S. Pat. No. 10,263,131 which are hereby incorporated by reference.

Figure 17B:
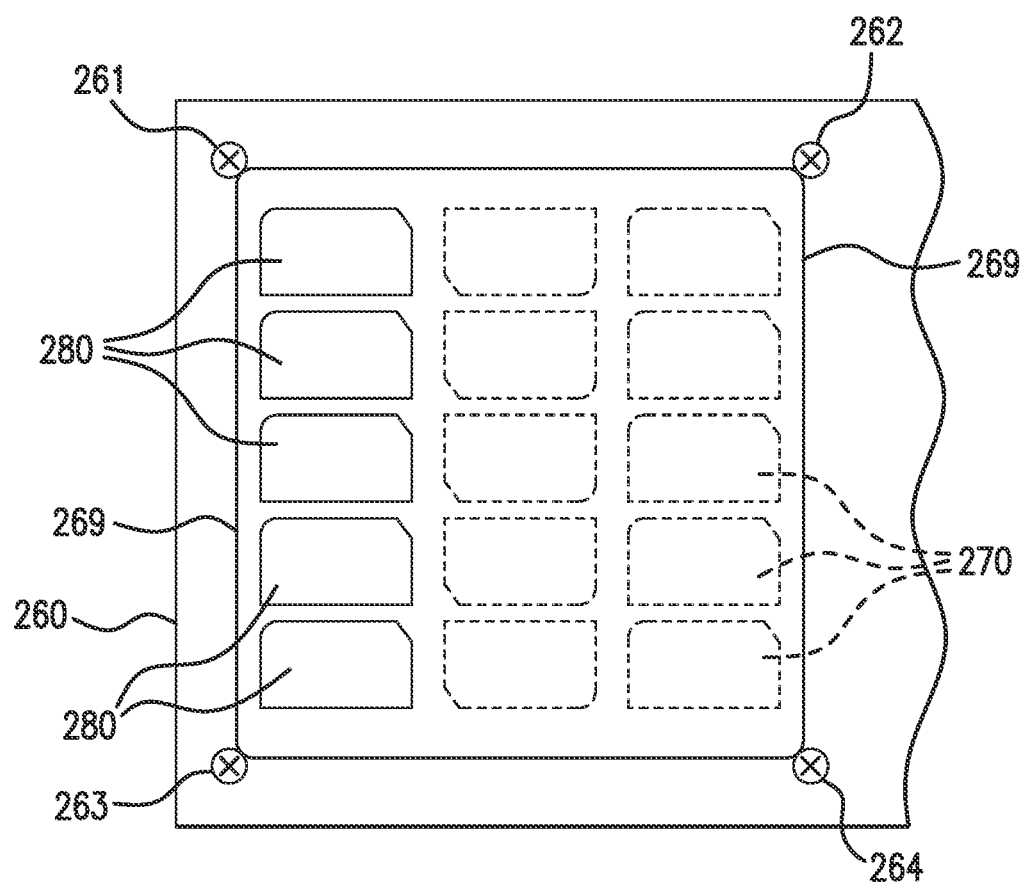
FIG. 17B is a top plan view of the face sheet of FIG. 17A with an overlying mask for defining a pattern of discrete adhesive regions in a column on the face sheet where the solar cell assemblies are to be mounted.

FIG. 17B is a top plan view of a face sheet 269 for supporting an array of solar cell assemblies (or CICs) to be mounted on the face sheet with an overlying mask 290 for defining a pattern of outlined discrete adhesive regions 280 in a rectangular array on the top of the face sheet where the solar cell assemblies are to be mounted. Also depicted are the regions 270 underlying the mask as described in FIG.

17A. Other embodiments may define the pattern of adhesive regions without using a mask.

Figure 17C:
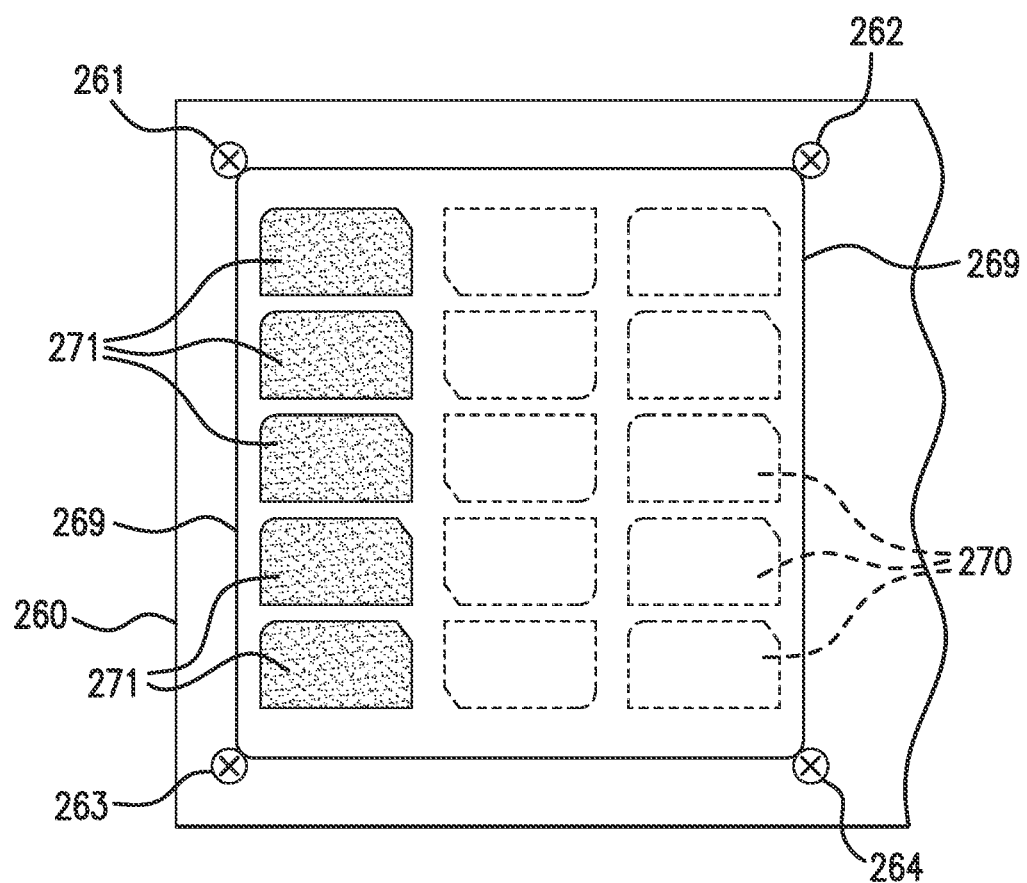
FIG. 17C is a top plan view of the face sheet of FIG. 17B after adhesive has been deposited in the adhesive region in a column on the face sheet.

FIG. 17C is a top plan view of the face sheet 269 of FIG. 17A after the adhesive has been dispensed and deposited in the adhesive regions 271 corresponding to the outlined regions 280 in FIG. 17B. The Figure also depicts additional outlined regions 270 where adhesive is to be subsequently deposited on the face sheet 269 in subsequent process steps.

Figure 17D:
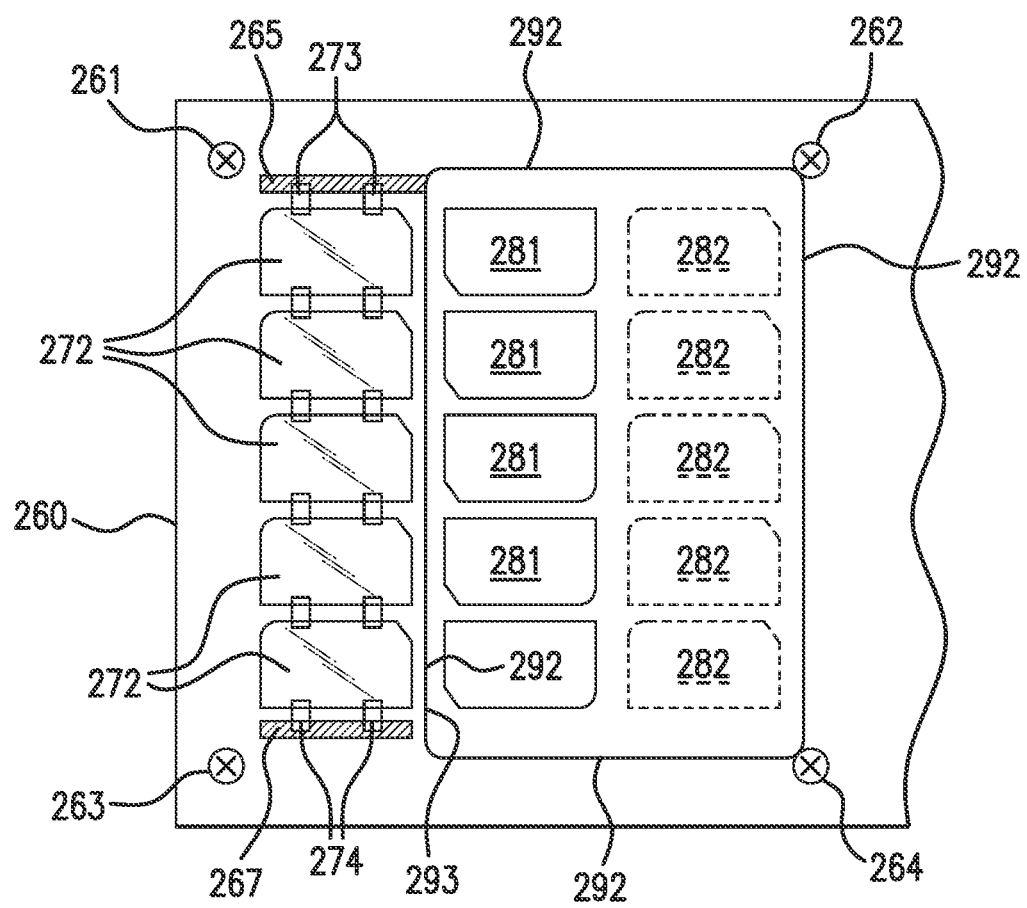
FIG. 17D is a top plan view of the face sheet FIG. 17B after the placement of a string of solar cell assemblies on the adhesive regions in the first column of the face sheet.

FIG. 17D is a top plan view of the face sheet 269 of FIG. 17B after the mask is removed from the first column of adhesive regions, and there is an alignment, positioning and placement of a string of solar cell assemblies 272 on the adhesive regions 271 of FIG. 17C. Heat or pressure, or both, is applied to the string of solar cell assemblies 272 to bond the string to the top side of the face sheet 269. The string of solar cell assemblies 272 is subsequently connected to traces 265 and 267 by means of electrical interconnects 273 and 274 respectively, establishing terminals of negative and positive polarity for the string of solar cell assemblies 272.

Figure 17E:
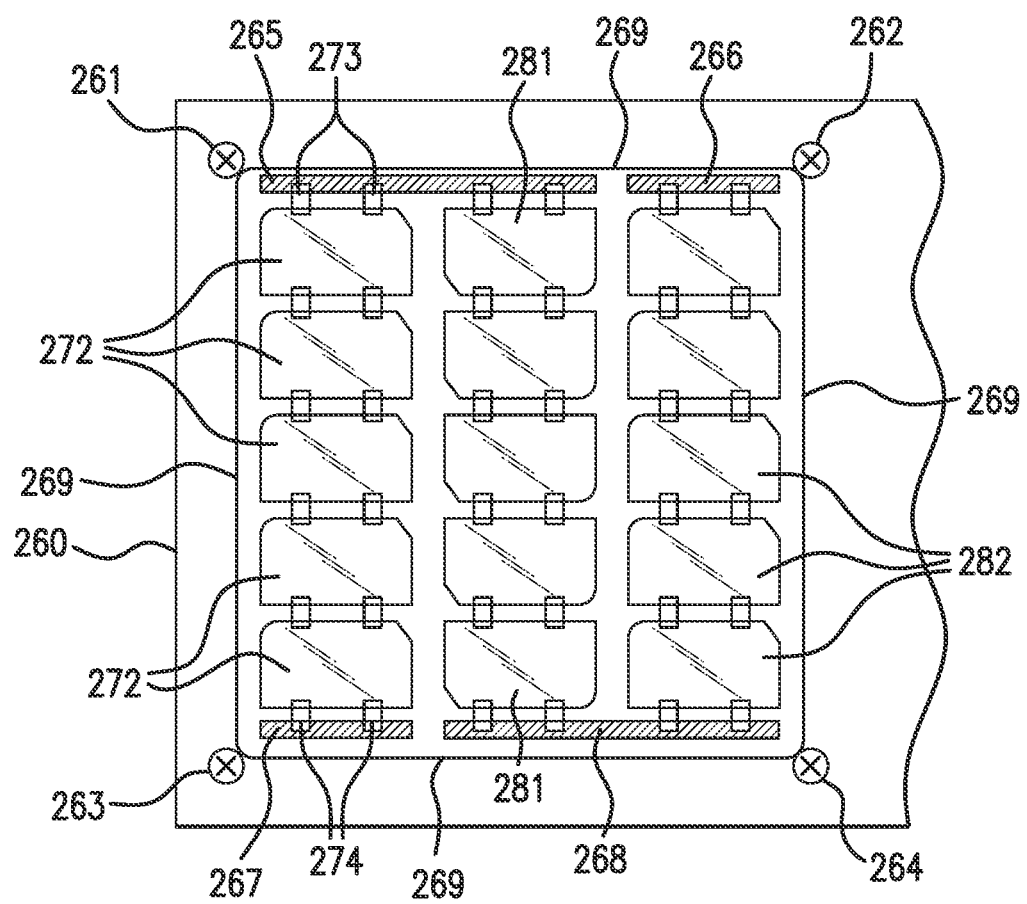
FIG. 17E is a top plan view of the face sheet after the placement of a sequence of strings along the top surface of the face sheet utilizing the process depicted in FIG. 17A through FIG. 17D.

FIG. 17E is a top plan view of the face sheet 269 after subsequent adhesive operations and the placement of a sequence of strings 272, 275, 276 along the top surface of the face sheet 269 utilizing the process of either FIG. 17C or FIG. 17D.

In this embodiment, three strings of solar cell assemblies 272, 281, and 282 are connected in electrical series on the top surface of the face sheet 269. The conductive trace 267 is connected to a terminal of a first polarity of the first string 272, and the terminal of second polarity of the first string 272 is connected to conductive trace 265 on the surface of the face sheet 269.

In this embodiment, the conductive trace 265 then extends to the region where solar cell assemblies 281 are arranged, thereby making an electrical connection between the string 272 and the string 281.

In this embodiment, the conductive trace 265 is connected to a terminal of a second polarity of the second string 273, and the terminal of second polarity of the second string 273 is connected to conductive trace 268 on the surface of the face sheet 269.

In this embodiment, the conductive trace 268 then extends to the region where solar cell assemblies 282 are arranged, thereby making an electrical connection between the second string 281 and the third string 282.

In this embodiment, the conductive trace 268 is connected to a terminal of a first polarity of the third string 282, and the terminal of second polarity of the third string 282 is connected to conductive trace 266 on the surface of the face sheet 269.

In this embodiment, the conductive trace 266 is the terminal of second polarity of the entire array of string assemblies 271, 281 and 282 where external electrical contact may be made.

Figure 18:
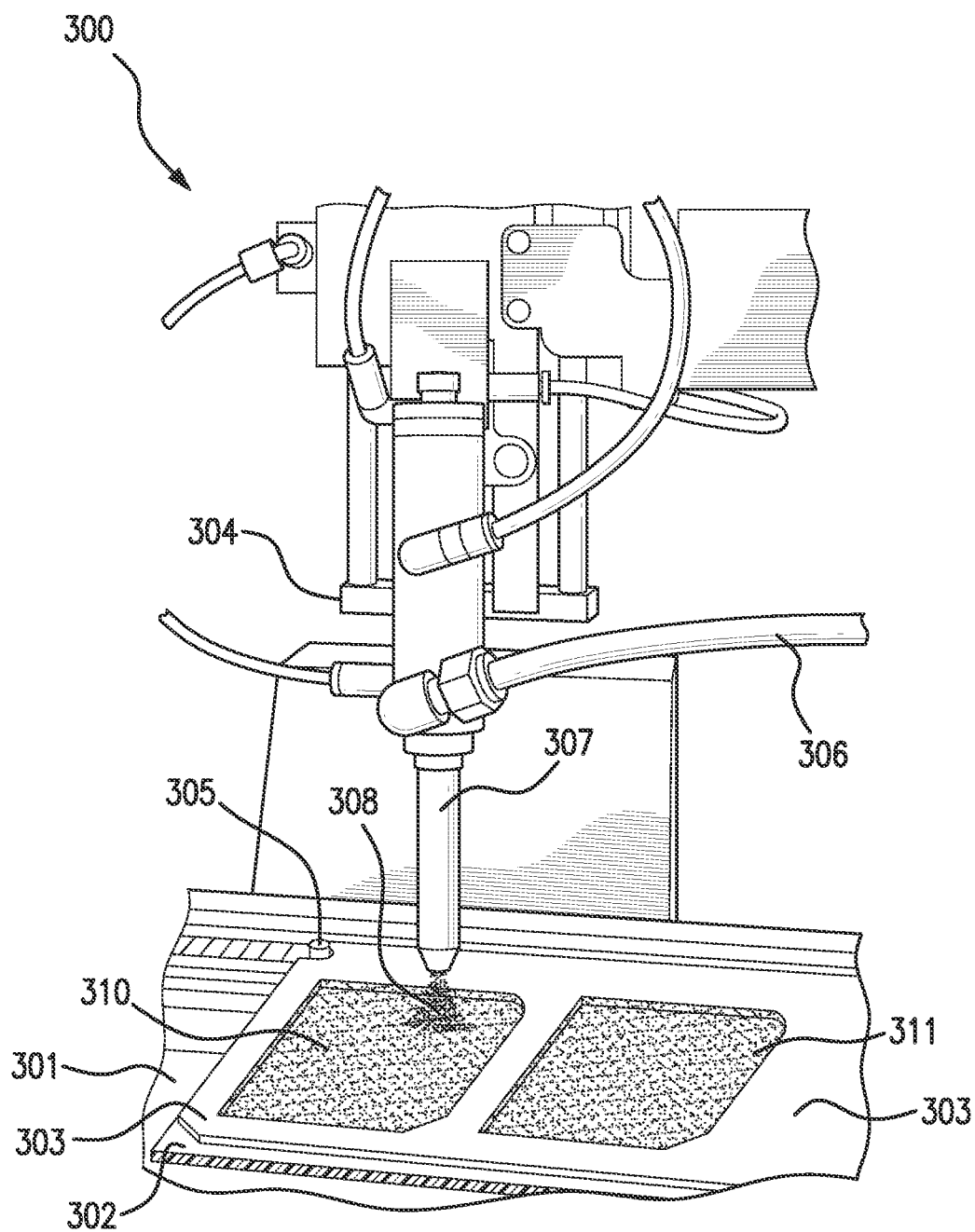
FIG. 18 is a perspective view of a tool with a single head for automatically dispensing adhesive either over the face sheet as in FIG. 17B or over the back side of the solar cell assemblies.

FIG. 18 is a simplified perspective view of an assembly fixture 300 and a generically depicted tool with a single head 307 for automatically dispensing adhesive either over the face sheet 302 as in FIG. 17C, or in a different embodiment and arrangement, over the back side of the solar cell assemblies.

FIG. 18 depicts an assembly fixture 300 with a platform 301 on which a face sheet 302 for mounting an array of CICs is to be assembled. The fixture may include a positioning tab 305a and fiducial mark which aligns with and couples to a corresponding notch 305b on the face sheet 303.

In the FIG. 18, a mask 303 is provided on the top of the face sheet 302, the mask 303 also including a correspondingly shaped notch 305b to align with and couple to the tab 305a on the fixture platform 301 to achieve appropriate alignment. The mask 303 includes a plurality of apertures 310, 311 which correspond to areas on the face sheet 302 to which adhesive is to be applied where the CICs are to be placed.

In the depicted embodiment, the adhesive is sprayed 308 on the face sheet 302 by a single spray head 307, which is moved from area to area on the face sheet. In other embodiments, adhesive may be applied by other techniques known in the art.

In other embodiments (not shown), a plurality of spray heads may be mounted on a gantry and employed to simultaneously spray the adhesive on a plurality of areas on the face sheet. In other embodiments, dispensing of the adhesive may be done by a skiving process or other technique.

The automated version of skiving is screen printing in which there can be effectively no screen (skiving on a uniform layer) or a screen over which the adhesive is skived to leave a pattern of adhesive behind. Another embodiment is a roll on method. The latter is generally a large surface area undertaking and the skiving or screen printing embodiment would most likely be done onto a face sheet such as rigid carbon fiber/Al-honeycomb sandwich panel, or onto a flexible polyimide substrate.

The adhesive dispensing head and the specific dispensing process is generally a "local" one and can be done in basically any areal pattern onto the face sheet or onto the back of the solar cell or CIC. The dispensing head may operate by methods such as positive displacement (piston, air pressure, etc.) or spray on. The pattern of dispensing can be a continuous layer, or discrete dots, spots, droplets, or whatever form or pattern achieves the desired bonding characteristics (area coverage, thickness, uniformity, degree of underfill, etc.).

The deposited adhesive thickness can be as low as 2 mils and as thick as about 25 mils. The optimum thickness is determined by the amount of adhesive required to account for variations in the surface profiles of the solar cell/CIC and the face sheet (rigid or flexible) and to accommodate backside features on the CIC such as interconnects or other components that would be embedded in the adhesive and might prevent the cell/CIC from contacting the substrate if the adhesive layer were thinner than the device components.

Generally, the thickness of the adhesive layer is controlled by process parameters (positive displacement is volumetric, screen printed thickness is determined by the screen thickness, etc.) and may be measured periodically during the fabrication process as a quality control technique using, for example, a graduated depth gauge for physical verification of the thickness.

Since in typical embodiments the CICs must be interconnected on the backside, it is generally the case that CICs will be assembled into strings or into more complex circuits or assemblies before they are mounted and bonded to the face sheet. Thus, it is typically more practical to apply the adhesive to the face sheet rather than directly to the CIC because handling the CIC string or assembled circuit is challenging. However, in some embodiments, a circuit or string of CICs may be initially processed face down, with all backside welds on the CICs made in an automated manner in a fixture by machine vision. Adhesive is then dispensed onto the backs of the CICs, or onto the face sheet, and the face sheet is brought into contact with CICs for bonding without ever removing the CICs from the welding fixture that aligned them to begin with.

Figure 19:
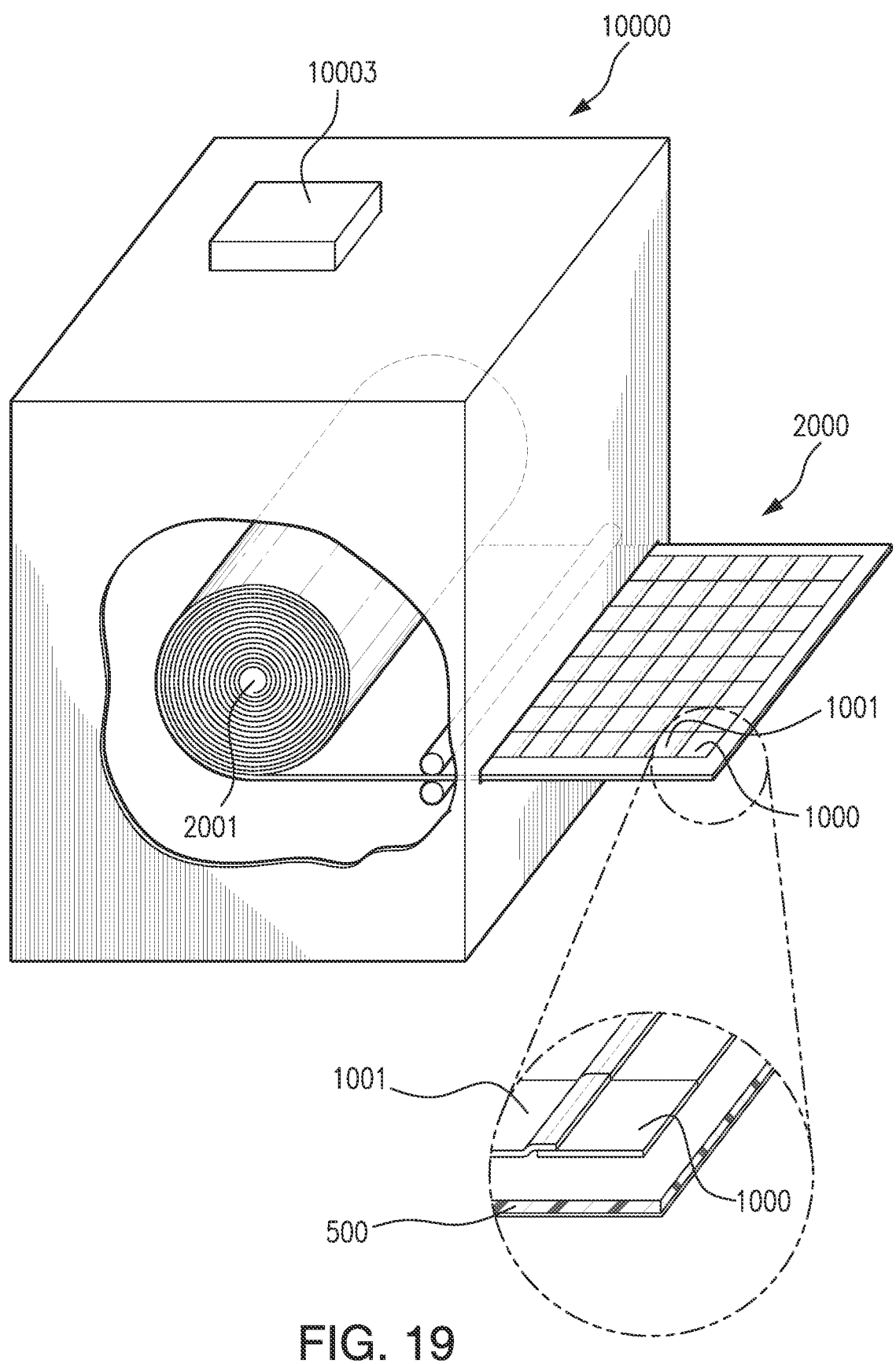
FIG. 19 is a highly simplified perspective view of a space vehicle in the process of deployment of a solar cell panel from a cylindrically shaped roll stowed in the space vehicle in which the solar cell panel is fabricated according to the present disclosure.

FIG. 19 is a highly simplified perspective view of a space vehicle 10000 in the process of deployment of a solar cell array from a cylindrically shaped roll that is stowed in the space vehicle in which the solar cell array incorporates the interconnected solar cell assemblies according to the present disclosure.

The solar cell array 2000 is in the form of a deployable flexible sheet including a flexible substrate 500 on which solar cell assemblies 1000 and 1001 according to the present disclosure are mounted. The sheet may be rolled into a cylindrical shape and wrap around a mandrel 2001 to allow stowage of the solar cell array 2000 in a compact form inside the housing of the space vehicle 10000 prior to being deployed in the desired position in the space orbit. The space vehicle 10000 includes a payload 10003 which is powered by the array of solar cell assemblies 2000.

It will be understood that each of the elements described above, or two or more together, also may find a useful application in other types of structures or constructions differing from the types of structures or constructions described above.

The terminology used in this disclosure is for the purpose of describing specific identified embodiments only and is not intended to be limiting of different examples or embodiments.

In the drawings, the position, relative distance, lengths, widths, and thicknesses of supports, substrates, layers, regions, films, etc., may be exaggerated for presentation simplicity or clarity. Like reference numerals designate like elements throughout the specification. It will be understood that when an element such as an element layer, film, region, or feature is referred to as being "on" another element, it can be disposed directly on the other element or the presence of intervening elements may also be possible. In contrast, when an element is referred to as being disposed "directly on" another element, there are no intervening elements present.

Furthermore, those skilled in the art will recognize that boundaries and spacings between the above described units/operations are merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

The terms "substantially", "essentially", "approximately", "about", or any other similar expression relating to particular parametric numerical value are defined as being close to that value as understood by one of ordinary skill in the art in the context of that parameter, and in one non-limiting embodiment the term is defined to be within 10% of that value, in another embodiment within 5% of that value, in another embodiment within 1% of that value, and in another embodiment within 0.5% of that value.

The term "coupled" as used herein is defined as connected, although not necessarily directly or physically adjoining, and not necessarily structurally or mechanically. A device or structure that is "configured" in a certain way is arranged or configured in at least that described way, but may also be arranged or configured in ways that are not described or depicted.

The terms "front", "back", "side", "top", "bottom", "over", "on", "above", "beneath", "below", "under", and the like in the description and the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein. For example, if the assembly in the figures is inverted or turned over, elements of the assembly described as "below" or "beneath" other elements or features would then be oriented "above" the other elements or features. Thus, the exemplary term "below" can encompass both an orientation of above and below. The assembly may be otherwise oriented (rotated by a number of degrees through an axis).

The terms "front side" and "backside" refer to the final arrangement of the panel, integrated cell structure or of the individual solar cells with respect to the illumination or incoming light incidence.

In the claims, the word 'comprising' or 'having' does not exclude the presence of other elements or steps than those listed in a claim. It is understood that the terms "comprises", "comprising", "includes", and "including" if used herein, specify the presence of stated components, elements, features, steps, or operations, components, but do not preclude the presence or addition of one or more other components, elements, features, steps, or operations, or combinations and permutations thereof.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the claim includes the introductory phrases "one or more" or "at least one" and indefinite articles such as "a" or "an". The same holds true for the use of definite articles.

The present disclosure can be embodied in various ways. To the extent a sequence of steps are described, the above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope and spirit of the present disclosure. The above embodiments can be modified without departing from the scope and spirit of the present disclosure which are to be defined by the attached claims. Accordingly, other implementations are within the scope of the claims.

Although described embodiments of the present disclosure utilizes a vertical stack of a certain illustrated number of subcells, various aspects and features of the present disclosure can apply to stacks with fewer or greater number of subcells, i.e. two junction cells, three junction cells, four, five, six, seven junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell C, with p-type and n-type InGaAs is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or emitter layer may also be instrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, GaAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand, LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells. Without further analysis, from the forgoing others can, by applying current knowledge, readily adapt the present invention for various applications. Such adaptions should and are intended to be comprehended within the meaning and range of equivalence of the following claims.

The invention claimed is:

1. A method of fabricating a solar cell array module comprising:
   a. providing a support;
   b. providing a face sheet having a top side and an opposite bottom side;
   c. mounting the bottom side of the face sheet on the support;
   d. dispensing an adhesive area on a plurality of discrete predefined regions on the top side of the face sheet where a string of solar cell assemblies is to be mounted using an automated process;
   e. automatically positioning and mounting an interconnected string of solar cell assemblies on the adhesive area regions on the top side of the face sheet; and
   f. applying heat or pressure to bond the interconnected string of solar cell assemblies to the adhesive area regions on the top side of the face sheet.

2. A method of fabricating a solar array module as defined in claim 1, wherein the step of dispensing an adhesive area on a plurality of discrete predefined regions on the top side of the face sheet is performed subsequent to the mounting of the bottom side of the face sheet on the support.

3. A method as defined in claim 1, wherein the adhesive area is sized and shaped to match and be congruent to that of a peripheral outline of the respective solar cell assembly to be mounted on the adhesive area.

4. A method as defined in claim 1, wherein the step of dispensing an adhesive area utilizes one of a (i) screen printing process; (ii) a spraying process; (iii) a roller application; (iv) a process using a screen over which the adhesive is skived; or (v) a dot, spot, droplet or continuous layer process.

5. A method as defined in claim 1, wherein the step of dispensing an adhesive area utilizes a tool consisting of one of a (i) positive displacement fixture utilizing a piston or air pressure applicator; (ii) spraying process; (iii) a roller; or (iv) a skiving blade.

6. A method as defined in claim 5, wherein the tool is adjustable to accommodate the volumetric amount of adhesive, the area coverage, thickness, uniformity, and degree of underfill of the adhesive area depending upon the physical characteristics of the solar cell assembly.

7. A method as defined in claim 5, wherein the tool for dispensing the adhesive has a single dispensing head that is automatically moved from one adhesive area region to another adhesive region using machine vision and sequentially applying adhesive to each adhesive area region.

8. A method as defined in claim 5, wherein the tool for dispensing the adhesive has a plurality of dispensing heads for simultaneously applying adhesive to a plurality of area regions in a single row or column, wherein the tool is automatically moved from that one row or column to the adjacent row or column using machine vision to then sequentially apply adhesive to each area region in that adjacent row or column.

9. A method as defined in claim 1, wherein the adhesive area has a thickness in the range of 2.0 to 25 mils.

10. A method of claim 1, wherein the face sheet is a flexible film composed of a polyimide or a poly (4, 4'-oxydiphenylene-pyromellitimide) material.

11. A method of claim 1, wherein the solar cell assembly is a cover glass-interconnect-solar cell (CIC) assembly in which the solar cells are compound semiconductor solar cells, and the assembly has a dimension in the range of 100 microns to 3 cm on a side.

12. A method of claim 1, wherein the support is either rigid or flexible and has a thickness of between 25 and 100 microns.

13. A method of claim 1, wherein the bottom side of the face sheet includes a plurality of layers of carbon composite sheets embedded in a matrix of cyanate ester adhesive that is co-cured with the face sheet.

14. A method of claim 1, wherein the adhesive area is composed of an acrylic or a silicone adhesive.

15. A method of claim 1, wherein the support is an aluminum honeycomb structure and further comprising mounting the aluminum honeycomb structure to the surface of a supporting panel of a satellite or space vehicle.

16. A method of claim 1, further comprising discrete predefined adhesive regions on the second side of the support, and mounting the second side of the support on a surface of a supporting panel of a CubeSat.

17. A method of claim 1, wherein the array of solar cell assemblies are automatically interconnected using a pick and place process for positioning the interconnectors between adjacent solar cell assemblies followed by automatic parallel gap welding.

18. A method as defined in claim 1, further comprising rolling the flexible support into a cylindrical shaped roll to permit stowage of the module in a space vehicle prior to deployment in space.

19. A method of fabricating a solar cell array module comprising:
   a. providing a support;
   b. providing a face sheet having a top side and an opposite bottom side;
   c. mounting the bottom side of the face sheet on the support;
   d. automatically bonding a interconnect member to each of the back sides of a sequence of solar cell assemblies by a sequential parallel gap welding process to provide a series electrical connection between the respective solar cell assemblies to form a string of solar cell assemblies;
   e. dispensing an adhesive area on a discrete predefined region on the back side of each of the solar cells in the string using an automated adhesive dispensing process;
   f. automatically positioning and mounting an interconnected string of solar cell assemblies on the top side of the face sheet.

* * * * *